United States Patent [19]

Takahashi

[11] Patent Number: 4,958,377
[45] Date of Patent: Sep. 18, 1990

[54] CHARACTER STRING IDENTIFICATION DEVICE WITH A MEMORY COMPRISING SELECTIVELY ACCESSIBLE MEMORY AREAS

[75] Inventor: Kousuke Takahashi, Tokyo, Japan

[73] Assignee: NEC Corporation, Tokyo, Japan

[21] Appl. No.: 146,164

[22] Filed: Jan. 20, 1988

[30] Foreign Application Priority Data

Jan. 20, 1987 [JP] Japan .................................. 62-11627
Jan. 22, 1987 [JP] Japan .................................. 62-13568
Feb. 9, 1987 [JP] Japan .................................. 62-28546
Aug. 10, 1987 [JP] Japan .................................. 62-200208

[51] Int. Cl.$^5$ .............................................. G06K 9/00
[52] U.S. Cl. .......................................... 382/34; 382/33; 365/49; 365/78
[58] Field of Search ............... 382/33, 56, 34; 365/49, 365/78

[56] References Cited

U.S. PATENT DOCUMENTS

| | | | |
|---|---|---|---|
| 3,241,123 | 3/1966 | Boucheron, Jr. ...................... | 365/49 |
| 3,353,159 | 11/1967 | Lee, III .................................. | 365/49 |
| 4,429,414 | 1/1984 | Asakawa .............................. | 382/34 |
| 4,433,392 | 2/1984 | Beaven ................................. | 382/34 |
| 4,641,278 | 2/1987 | Saito ..................................... | 365/49 |
| 4,670,858 | 6/1987 | Almy ..................................... | 365/49 |
| 4,783,830 | 11/1988 | Johnson et al. ...................... | 382/34 |

FOREIGN PATENT DOCUMENTS

60-211539 10/1985 Japan .
61-145634 7/1986 Japan .
61-253536 11/1986 Japan .
61-267130 11/1986 Japan .

Primary Examiner—Leo H. Boudreau
Assistant Examiner—Yon Jung
Attorney, Agent, or Firm—Foley & Lardner, Schwartz, Jeffery, Schwaab, Mack, Blumenthal & Evans

[57] ABSTRACT

In a character identification device for identifying an input character to produce an identified code, a memory circuit (40) decides a match between the input character and stored characters preliminarily stored therein to produce a character match signal. An encoder (50) encodes the character match signal into the identified code. The memory circuit (40) includes a plurality of memory areas (41 to 44). A memory area selector (54) selects a specific memory area in response to a selection signal produced from a signal producing circuit (52) to supply the input character to the specific memory area. In a character string identification device, a processing circuit (90) uses the character match signal to generate a string match signal which is encoded into the identified code by the encoder (51). The processing circuit (90) may include several processing sections (91 to 94) equal in number to the memory areas. An activating arrangement (182) activates a particular one of the processing sections that corresponds to the specific memory area. The identified code may be provided to the memory circuit as the input character through an interruption switch circuit (226).

2 Claims, 25 Drawing Sheets

| | |
|---|---|
| is-a | RELATION OF INCLUSION |
| part-of | RELATION OF PART |
| a-kind-of | RELATION OF CHARACTERISTIC SIMILARITY |
| instance-of | RELATION OF EXAMPLE |

FIG.6

| | A | B |
|---|---|---|
| is-a | HUMAN BEING | ANIMAL |
| part-of | MEAT | ANIMAL |
| a-kind-of | MEAT | FOOD |
| instance-of | ROAST MEAT | FOOD |

NATURAL LANGUAGE PROCESSING TECHNIQUE
ELEMENTARY NATURAL LANGUAGE PROCESSING
LANGUAGE INFORMATION PROCESSING TECHNIQUE

— — — — — — — — —

NATURAL LANGUAGE PROCESSING
LANGUAGE INFORMATION PROCESSING
LANGUAGE PROCESSING TECHNIQUE
INFORMATION PROCESSING TECHNIQUE

— — — — — — — — —

NATURAL LANGUAGE
LANGUAGE PROCESSING
LANGUAGE INFORMATION
INFORMATION PROCESSING
PROCESSING TECHNIQUE

— — — — — — — —

NATURAL
LANGUAGE
PROCESSING
TECHNIQUE
ELEMENTARY
INFORMATION

FIG. 28

| First Memory Area (41) | Identified Code (First Code Character) | Second Memory Area (42) | Identified Code (Second Code Character) | Third Memory Area (43) | Identified Code (Third Code Character) |
|---|---|---|---|---|---|
| NATURAL | A | AB | a | ag | I |
| LANGUAGE | B | BC | b | ah | II |
| PROCESSING | C | BF | d | dg | III |
| TECHNIQUE | D | FC | e | fg | IV |
| ELEMENTARY | E | GF | f | ai | V |
| INFORMATION | F | CD | g | di | VI |
| KNOWLEDGE | G | CE | h | fh | VII |
| | | C | i | bj | IIX |
| | | D | j | | |

FIG. 29

CHARACTER STRING IDENTIFICATION DEVICE WITH A MEMORY COMPRISING SELECTIVELY ACCESSIBLE MEMORY AREAS

BACKGROUND OF THE INVENTION

This invention relates to a character identification device or a character string identification device for identifying an input character or a sequence of input characters such as text information or a communication message to produce an identified code indicative of a result of identification.

The character identification device or the character string identification device are for use in an address conversion or translation system, an expert system, an information retrieval system, a pattern recognition system, a local area network system, a machine translation system, or the like.

A most typical method for retrieving contents of the input character string such as the text information has been performed by software in computers that is called a matching process program. Various character strings such as keywords or destinations of message are preliminarily memorized in a memory as memorized character strings. Responsive to the input character string, the matching process program matches the input character string with one of the memorized character strings. The matching process program produces a match signal when the input character string coincides with the one of the memorized character strings. Otherwise, the matching process program produces a mismatch signal and matches the input character string with other memorized character strings.

Providing that an eight-character unit it called a byte, a retrieval processing rate per memorized character string is equal to one megabytes/sec when each memorized character string has an eight-character length and when time for comparison of the character string is equal to one microsecond.

The above-mentioned conventional method has been disadvantageous in that the retrieval processing rate is slow in inverse proportion to the number of the memorized character strings. For example, the retrieval processing rate is equal to four kilobytes/sec, when the number of the memorized character strings is equal to 256.

On the other hand, the retrieval processing rate is decided by a maximum length of the memorized character string when the memorized character strings have various character lengths. For example, the retrieval processing rate is 256 bytes/sec when the maximum character length is 128.

In order to reduce the disadvantage, a prior character string identification device is revealed in a prior patent application, U.S. patent application Ser. No. 720,930 filed Apr. 8, 1985, by the present applicant, based on Japanese Patent Application No. 68495 of 1984 and No. 267831 of 1984 which are published in Japanese Unexamined Patent Prepublications, as Kôkai No. Syô 60-211539 (JP-A-60-211,539) and Kôkai No. Syô 61-145634 (JP-A-61-145634), respectively. The character string identification device disclosed by the prior patent application comprises an associate memory, a sequential processing circuit, and a priority encoder. The associative memory has memory locations assigned with addresses and preliminarily stores a plurality of characters as memorized characters. The associative memory decides a best match between each input character and one of the memorized characters to produce a character match signal representative of the address for the above-mentioned one of the memorized characters. In the associative memory, the memory locations are classified in several location sets each being assigned with successive addresses at which only one of the character strings is memorized. The sequential processing circuit sequentially processes the character match signals produced for the respective input characters into a string match signal. The priority encoder encodes the string match signal into an encoded signal to produce the encoded signal as an identified code. The character string identification device is capable of raising the retrieval processing rate by matching the input character string with a number of memorized character strings in parallel.

Therefore, such a character string identification device is suited for large scale integration (LSI). The priority encoder, however, has a larger area in an LSI chip in proportion to the number of the memorized character strings. Accordingly, the prior character string identification device is still disadvantageous in that it is difficult to increase the number of the memorized character strings.

On the other hand, the match signal will never be produced when an error, an erroneous addition, or an erroneous omission occurs even in one character of either the input character string or the memorized character strings. In order to relieve this problem, the above-mentioned conventional method preliminarily memorizes in the memory not only the memorized character strings but also modified character strings with each modified character string formed by intentionally being introduced into the memorized character strings. Therefore, the above-mentioned conventional method has been defective in that the retrieval processing rate is extremely slow in inverse proportion to the number of the modified character strings and the lengths of the modified character strings and of the memorized character strings. When each of the memorized character strings has a length of eight characters each of which is a character code of eight bits, the number of the modified character strings per memorized character string is equal to $2 \times 8 \times 2^8$, namely, 4096. Accordingly, the retrieval processing rate goes down about one bytes/sec from the above-referenced rate of four kilobytes/sec which is attained without use of the modified character strings.

In order to remove the defect, another prior character string identification device is revealed in Japanese Unexamined Patent Prepublications, Kôkai No. Syô 61-253,536 (JP-A-61-253,536) and Kôkai No. Syô 61-267,130 (JP-A-61-267,130) for Japanese Patent Applications No. 96213 of 1985 and No. 108667 of 1985 filed by the present assignee from the present applicant et al. The character string identification device has a modified sequential processing circuit in addition to the associate memory. This makes it possible to raise the retrieval processing rate by matching the input character string to a number of memorized character strings and a greater number of modified character strings in parallel.

However, the modified sequential processing circuit occupies a larger area in comparison with the associative memory when the character string identification device is realized by a very-large-scale integrated circuit (VLSI) of one chip. Accordingly, the character string identification devices of the Japanese Patent Prepublications are disadvantageous in that it is difficult to increase a capacity of the association memory.

SUMMARY OF THE INVENTION

It is an object of this invention to provide a character identification device or a character string identification device which are capable of increasing the number of memorized characters or memorized character strings without having a larger area for an encoder which is typically a priority encoder.

It is another object of this invention to provide a character string identification device of the type described, which is capable of increasing a capacity of an associative memory without having a larger area for a modified sequential processing circuit.

A character identification device to which this invention is applicable is for indentifying an input character to produce an identified code indicative of a result of identification. The character identification device includes associative memory means having memory locations assigned with addresess for preliminarily storing a plurality of memorized characters and deciding a best match between the input character and one of the memorized characters to produce a character match signal representative of the address for the above-mentioned one of the memorized characters, and encoding means coupled to the associative memory means for encoding the character match signal into an encoded signal to produce the encoded signal as the identified code. According to this invention, the associative memory means includes first through N-th memory areas each of which has memory locations arranged to be assigned with addresses in common, where N represents a predetermined number. The character identification device further includes signal producing means for producing a selection signal indicative of one of the first through the N-th memory areas as a specific memory area, and supplying means coupled to the first through the N-th memory areas and the signal producing means for supplying the input character in response to the selection signal to the specific memory area to the specific memory area to produce the character match signal.

A character string identification device to which this invention is applicable is for identifiying a sequence of input characters to produce an identified code indicative of a result of identification. The character string identification device includes associative memory means having memory locations assigned with addresses for preliminarily storing a plurality of memorized characters and deciding a best match between each of the input characters and one of the memorized characters to produce a character match signal representative of the address for the above-mentioned one of the memorized characters, sequential processing means coupled to the associative memory means for sequentially processing the character match signals produced for the respective input characters into a string match signal, and encoding means coupled to the sequential processing means for encoding the string match signal into an encoded signal to produce the encoded signal as the identified code. According to this invention, the associative memory means includes first through N-th memory areas each of which has memory locations arranged so as to be assigned with addresses in common, where N represents a predetermined number. The character string identification device further includes signal producing mean for producing a selection signal indicative of one of the first through the N-th memory areas as a specific memory area, and supplying means coupled to the first through the N-th memory areas and the signal producing means for supplying each of the input characters in response to the selection signal to the specific memory area to cause the specific memory area to produce the character match signal.

BRIEF DESCRIPTION OF THE DRAWINGS

FIG. 6 is a view of an example of relation predicates together with an epitome of meanings thereof for use in the character identification device as a semantic network;

FIG. 7 is a view of an example of the relation predicates and data related therewith as memorized characters;

FIG. 28 is a view of an example of language phrases; and

FIG. 29 is a view of an example of memorized characters stored in an associative memory circuit of the character string identification device shown in FIG. 27 together with identified codes.

DESCRIPTION OF THE PREFERRED EMBODIMENTS

Figure 1:
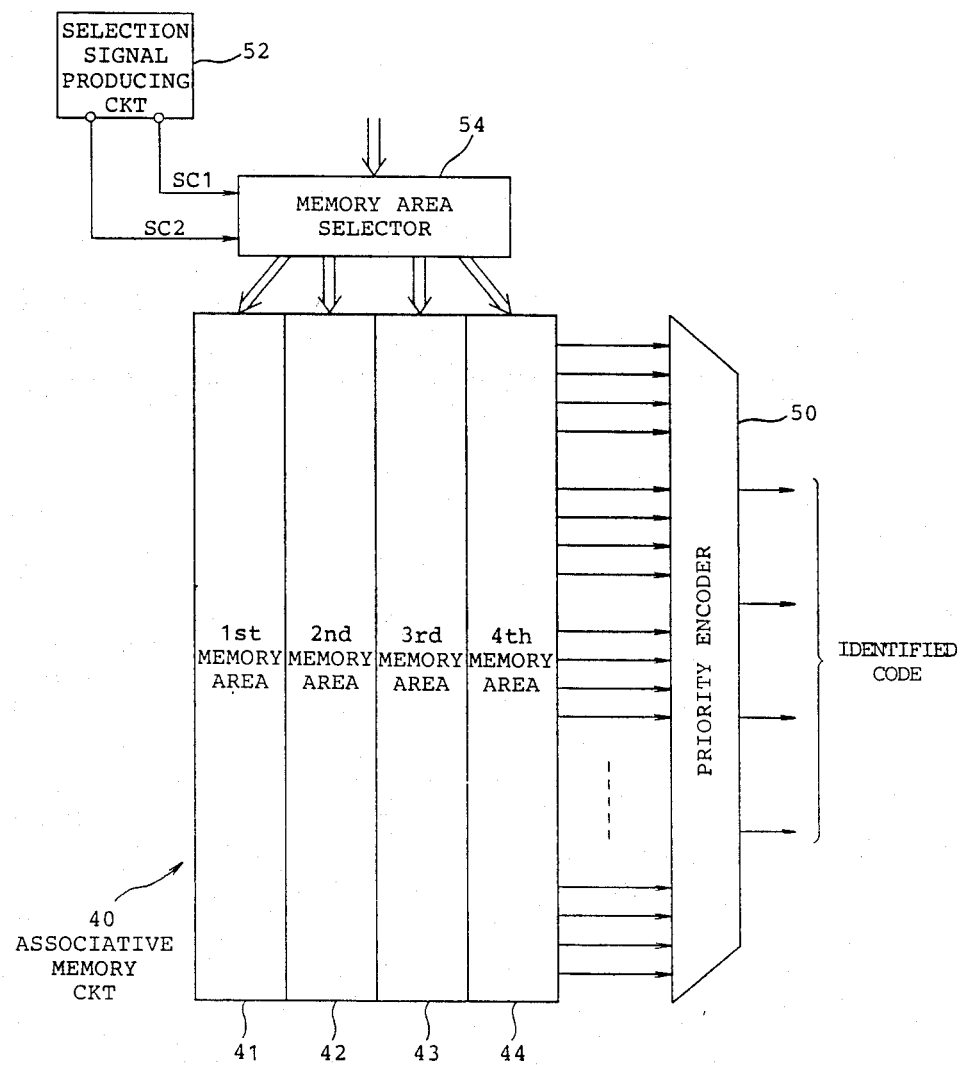
FIG. 1 is a block diagram of a character identification device according to a first embodiment of the present invention.

Referring to FIG. 1, a character identification device according to a first embodiment of the present invention is for identifying an input character to produce an identified code indicative of a result of identification.

The illustrated character identification device includes an associative memory circuit 40 which has memory locations assigned with address for preliminarily memorizing a plurality of characters as memorized characters. The associative memory circuit 40 is for deciding a best match between the input character and one of te memorized characters that will be called a particular character. The associative memory circuit 40 produces a character match signal representative of the address for the particular character.

Figure 23:
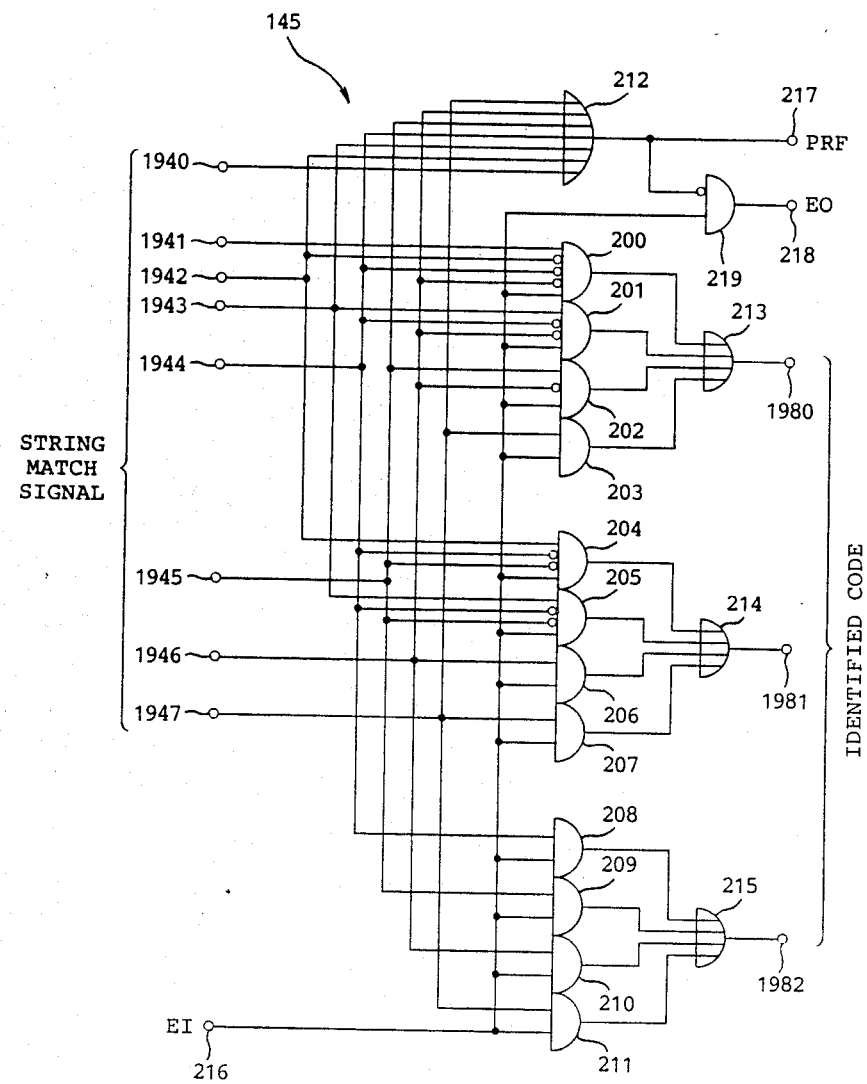
FIG. 23 is a circuit diagrm of a priority encoder used in the character string identification device.

The associative memory circuit 40 is coupled to a priority encoder 50 for encoding the character match signal into an encoded signal. The priority encoder 50 produces the encoded signal as the identified code. The priority encoder is well known in the art. An example is shown in FIG. 23 for eight-bit to three-bit priority encoder.

As illustrative in FIG. 1, the associative memory circuit 40 includes first through fourth memory areas 41, 42, 43, and 44. Each of the first through the fourth memory areas 41 to 44 has the memory locations arranged so as to be assigned with common addresses. At each of the addresses are stored characters which are equal in number. The illustrated character identification device further comprises a selection signal producing circuit 52 for producing a selection signal indicative of one of the first through the fourth memory areas 41 to 44 as a specific memory area. In this embodiment, the selection signal has a selection code of two code bits SC1 and SC2. The selection signal indicates the first memory area 41 as the specific memory area when the selection code bits SC1 and SC2 are "00," while the selection signal indicates the second memory area 42 as the specific memory area when the selection code bits are "01." Similarly, the selection signal indicates the third and the fourth memory areas 43 and 44 as the specific memory areas when the selection code bits are "10" and "11," respectively. The selection signal and the input character are applied to a memory area selector 54. The memory area selector 54 acts as a supplying arrangement for supplying the input character in response to the selection signal to the specific memory area to make the specific memory area produce the character match signal.

Figure 2:
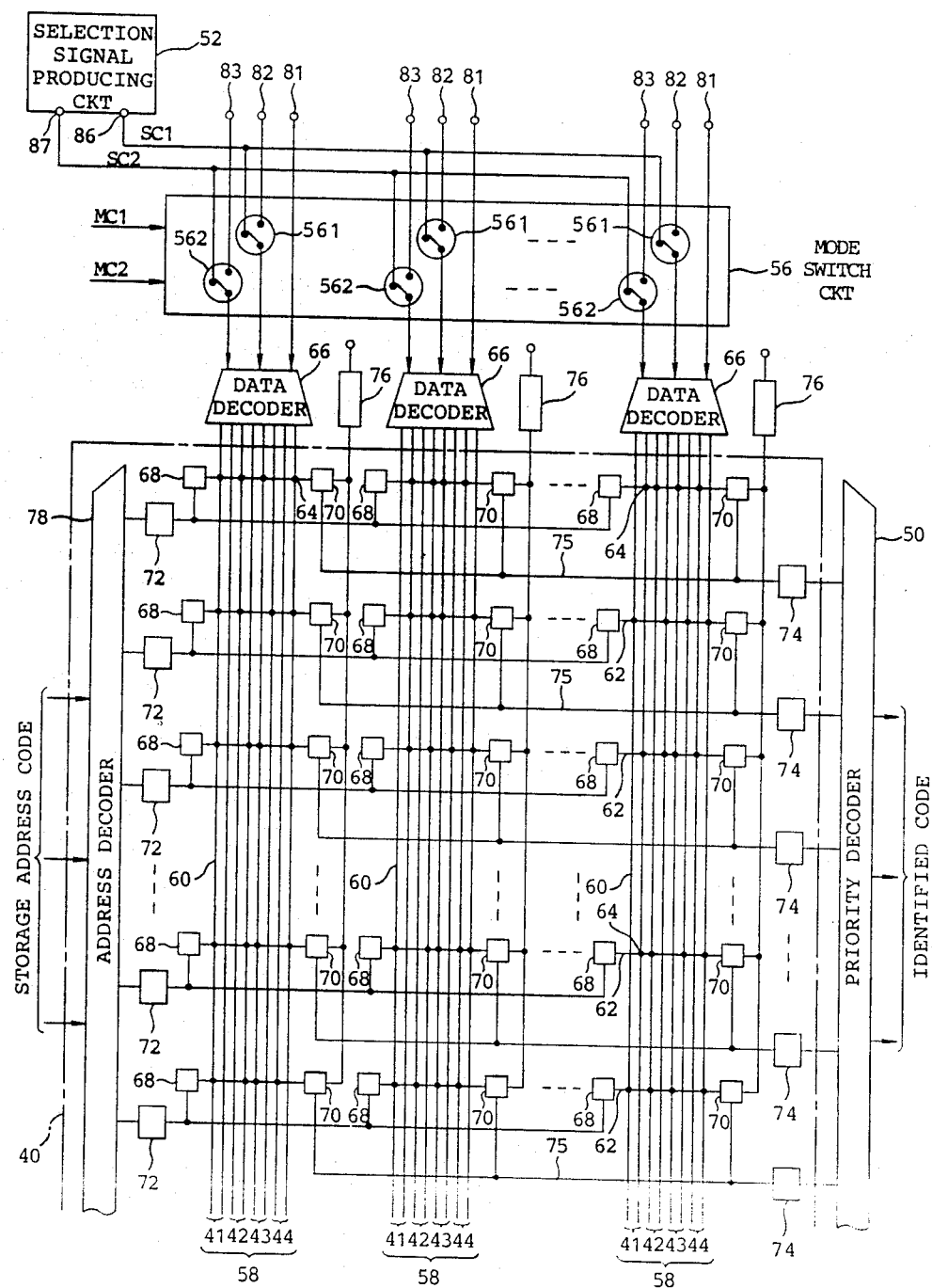
FIG. 2 is a block diagram of a character identification device according to a second embodiment of the present invention.

Referring to FIG. 2, a character identification device according to a second embodiment of the present invention is similar to that illustrated in FIG. 1 except that the device comprises a mode switch circuit 56 responsive to a mode control signal for selecting the selection signal and the input character to produce a selected input character in the manner which will later be described.

Figure 26:
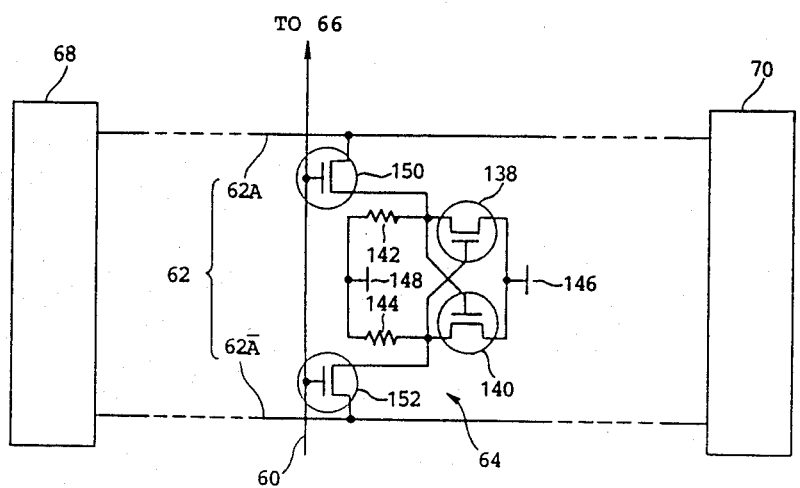
FIG. 26 is a circuit diagram of a memory cell used in the associative memory circuit.

The associative memory circuit 40 comprises a plurality of memory matrixes 58 each of which comprises eight longitudinal lines (word lines) 60 and a plurality of horizontal lines (bit lines) 62. A plurality of memory cells 64 are arranged at points of intersection of the word lines 60 and the bit lines 62. The memory cell may be a dynamic random access memory (RAM) cell, a static RAM cell (which is shown in FIG. 26), an electrically alterable read only memory (EAROM) cell, or other memory cell.

The illustrated character identification device comprises a plurality of data decoders 66 each of which is connected to the eight word lines 60 of each memory matrix 58. The data decoders 66 act as the memory area selector 54 shown in FIG. 1 as will later become clear.

The memory cells 64 arranged along each bit line 62 are equal in number to the word lines of each memory matrix 58. Each of the bit lines 62 is connected to an individual write-in circuit 68 and an individual read-out circuit 70. The individual write-in circuits 68 are coupled to a common write-in circuit 72 which is assigned to each bit line 62. The read-out circuits 70 are coupled to a common read-out circuit 74 through a wired AND line 75 for each bit line 62.

In FIG. 2, the illustrated character identification device further comprises a plurality of masking circuits 76 each of which is connected to the individual read-out circuits 70 corresponding to each memory matrix 58. The masking circuit 76 is for modifying outputs of the individual read-out circuits 70 connected thereto.

An address decoder 78 is coupled to the common write-in circuits 72. The priority encoder 50 is coupled to the common read-out circuits 74. The address decoder 78 decodes a storage address code into a decoded signal indicative of a particular one of the common write-in circuits 72 to make the particular common write-in circuit produce a write indication signal.

In this embodiment, the mode control signal has a mode control code of two code bits MC1 and MC2. The mode switch circuit 56 comprises a plurality of switches 561 and 562 which are controlled by the mode control code bits MC1 and MC2, respectively. Pairs of the switches 561 and 562 are equal in number to the data decoders 66. The mode switch circuit 56 is connected to a plurality of data input terminals 81, 82, and 83. Sets of the input terminals 81 through 83 are equal in number to the data decoders 66. The selection code bits SC1 and SC2 are supplied from selection output terminals 86 and 87 of the selection signal producing circuit 52, respectively. Each of the switches 561 selects one of the data input terminal 82 and the selection output terminal 86 in response to the mode control code bit MC1 while each of the switches 562 selects one of the data input terminal 83 and the selection output terminal 87 in response to the mode control code bit MC2. Each of the data decoders 66 is supplied from the data input terminal 81 and the switches 561 and 562 with a signal of three bits. When the pairs of switches 561 and 562 select the data input terminals 82 and 83 (case (a)), the input character is supplied from all of the data input terminals 81, 82, and 83. Each three bits in the input character are supplied to each data decoder 66. When the switches 561 (the switches 562) select the data input terminals 82 (the data input terminals 83) and when the switches 562 (the switches 561) select the selection output terminal 87 (the selection output terminal 86) (case (b)), the input character is supplied from the data input terminals 81, and 82 (83). In case (b), each of the memory matrixes 58 is divided into two areas each of which is selected by the data decoder 66 connected thereto in response to the selection code 87 (86). Each two bits in the input character are supplied to each data decoder 66. When the switches 561 and 562 select the selection output terminals 86 and 87 (case (c)), the input character is supplied through the data input terminal 81. Each bit in the input character is applied to each data decoder 66. In case (c), each of the memory matrixes 58 is divided into four memory areas each of which is selected by the data decoder 66 connected thereto in response to the selection codes SC1 and SC2.

In FIG. 2, it should be pointed out that the character identification device is different from the character identification illustrated with reference to FIG. 1 in that the number of the memory areas is variable. When the switches 561 and 562 select the selection output terminals 86 and 87, respectively, the associative memory circuit 40 is divided into the first through the fourth memory areas 41 to 44 each having memory locations which are assigned common addresses.

Operation will be described regarding the character identification device according to the second embodiment. Description will be at first made in connection with operation of storing characters in the memory matrixes 58. Now, case (c) is assumed where the switches 561 and 562 select the selection output terminals 86 and 87, respectively. A character to be stored in supplied to the data input terminals 81. The selection signal producing circuit 52 produces the selection signal. When the storage address code is supplied to the address decoder 78, the particular one of the common write-in circuit 72 is indicated by the address decoder 78 to deliver the write indication signal to the individual write-in circuits 68 connected thereto. In each of the memory matrixes 58, the logic "1" level is written in one of the memory cells 64 that is coupled to the word line 60 selected by the data decoder 66 and to the bit line 62 connected to the individual write-in circuit 68 supplied with the write indication signal. As a result of the above-mentioned operation, a plurality of characters to be stored are successively preliminarily memorized as memorized characters in one memory area selected by the selection signal. By sequentially changing the selection signal, a plurality of characters can be stored in all of the memory areas in the associative memory circuit 40, respectively.

In case (a), the selection signal is not used and the characters to be stored are applied through data input terminals 81, 82, and 83. In case (b), one of the two selection codes is used and the characters to be stored are supplied through data input terminals 81 and 82 (83). The characters are stored in two memory areas in the associative memory circuit 40.

By the way, all the memorized characters are simultaneously cancelled by a clear signal (not shown). The memorized character memorized at a particular address in a particular one of memory areas 41 through 44 is cancelled by twice writing the logic "0" level into the particular address of the particular memory area in the following manner. That is, at first, the logic "0" level writing is carried out with all of the data input terminals 81 being the logic "1" level and then the logic "0" level writing is also carried out with all of the data input terminals 81 being the logic "0" level.

Description will be made in connection with operation of identification of the input character. Let the input character be supplied through the mode switch circuit 56 to the data decoders 66 connected to the word lines 60. A particular one of the word lines 60 is put into an active state. If the logic "1" level is stored in the memory cell 64 coupled to the particular word line 60, the individual read-out circuit 70 connected thereto produces a read-out signal of the logic "1" level. The common read-out circuit 74 produces the character match signal when the read-out signal of the logic "1" level is produced from all of the individual read-out circuits 70 connected thereto. The priority encoder 50 detects which of the common read-out circuits 74 produces the character match signal. The priority encoder 50 encodes the character match signal into the encoded signal and produces the encoded signal as the identified code.

It will be assumed that the data decoders 66 are equal in number to M where M represents a predetermined number. In case (a) where the switches 561 and 562 select the data input terminals 82 and 83, respectively, it is possible to identify the input character having a length of 3M bits. In case (b) where the switches 561 and 562 select the selection output terminals 86 and 87, respectively, it is possible to identify the input character having a length of M bits. In case (c) where the switches 561 and 562 select the data input terminal 82 and the selection output terminal 87, respectively, it is possible to identify the input character having a length of 2M bits.

When a mask signal is supplied to the masking circuit 76, the individual read-out circuits 70 connected thereto produce outputs all with the logic "1" level. Therefore, it is possible to identify the input character with a part ignored in accordance with the mask signal. For example, the associative memory circuit 40 does not usually produce the character match signal when a data signal of "11000101" alone is memorized in the associative memory circuit 40 as the memorized character and when a different data signal of "11010101" is supplied to the associative memory circuit 40 as the input character. However, the associative memory circuit 40 produces the match signal if the mask signal is supplied to the masking circuit 76 to mask a fourth bit as counted from the most significant bit (MSB) of the memorized character. This is because the logic "1" level of the fourth bit for input character is ignored.

Figure 3A:
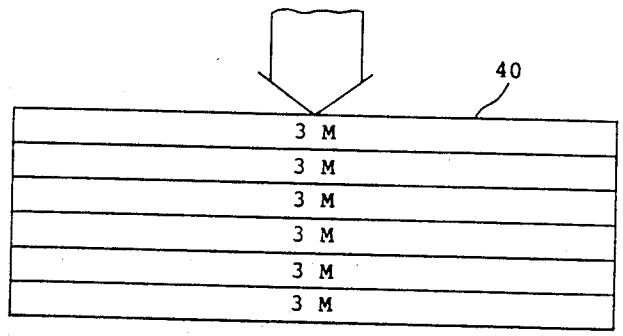
FIGS. 3(a), (b), and (c) are views for use in describing operation of the character identification device shown in FIG. 2.
Figure 3B:
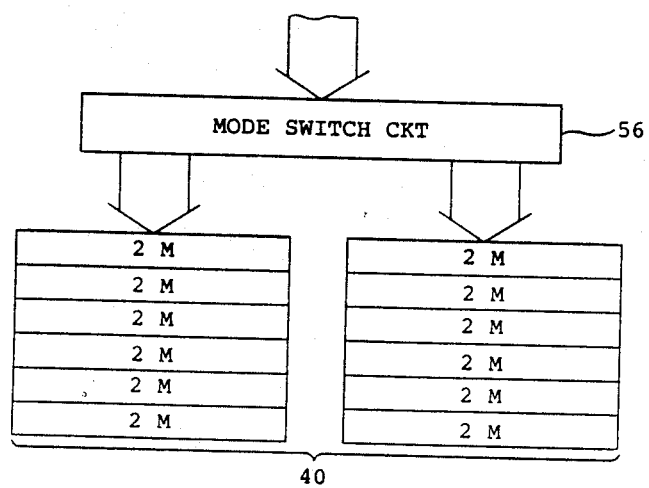
Figure 3C:
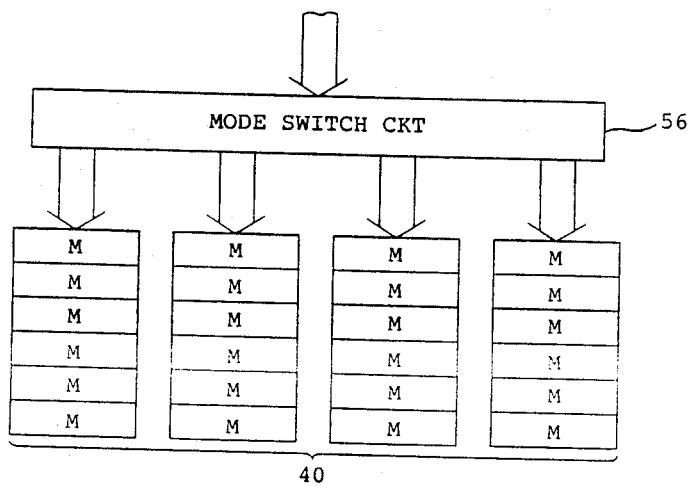

Referring to FIGS. 3(a), (b), and (c), the operation mode of the second embodiment illustrated in FIG. 2 will be described. In FIGS. 3(a) through (c), the memorized characters have lengths or widths indicated by 3M, 2M, and M. In the figures, it will be assumed that the common write-in circuits 72 (the wired AND circuits 74) are equal in number to six.

In FIG. 3(a), the associative memory circuit 40 preliminarily memorizes the memorized characters each of which has a bit length of 3M bits when the selection signal is not used under control of the mode switch circuit 56 (case (a)). When M is a large number, the input character has a large width. In this case, the input character is simultaneously compared with all of the six memorized characters memorized in the associative memory circuit 40.

In FIG. 3(b), the associative memory circuit 50 preliminarily memorizes the memorized characters each of which has a bit length of 2M bits when the one selection code bit SC1 of the selection signal alone is used under control of the mode switch circuit 56 (case (b)). In this case, it is possible to arrange the memory locations of the memory circuit 40 in two memory areas and to memorize twelve memorized characters in the two memory areas. The input character is supplied to one of the two memory areas in response to the selection code bit SC1. Accordingly, the input character is compared with all of the six memorized characters memorized in the memory area selected by the selection code bit SC1.

In FIG. 3(c), the associative memory circuit 40 preliminarily memorizes the memorized characters each of which has a bit length of M bits when the selection code bits SC1 and SC2 of the selection signal are used under control of the mode switch circuit 56 (case (c)). In this case, it is possible to arrange the memory locations of the memory circuit 40 in four memory areas, namely, in the first through the fourth memory areas 41 to 44 and to memorize twenty-four memorized characters in the first through fourth memory areas. The input character is supplied to one of the first through the fourth memory areas 41 to 44 in response to the selection code bits SC1 and SC2. Accordingly, the input character is compared with all of the six memorized characters memorized in the one memory area selected by the selection code bits SC1 and SC2.

Masking of a part of the memorized character is carried out at a unit of three, two, and one bits in the cases (a), (b), and (c), respectively. Eight memory cells are used for three bits of each memorized character in the case (a) while four memory cells are used for two bits of each memorized character in the case (b). Two memory cells are used for one bit of each memorized character in the case (c).

Under the circumstances, the shorter bit length is preferred. It will be assumed that the number M is equal to thirty-two. In this case, the character identification device must be used in the mode of the case (a) if each memorized character has the bit length equal to one hundred and twenty-eight bits. However, it is generally preferable that the character identification device is used in the mode of the case (c).

It should be pointed out that the case (c) is disadvantageous in that the input character is not simultaneously compared with all of the memorized characters in the associative memory circuit 40. However, it is possible to reduce the disadvantage by using a method which will be described in the following.

It will be understood that one or two items of data to be stored in the memory circuit 40 can be assigned to two code bits SC1 and SC2 of the selection signal. In the case, a plurality of sets of data which commonly include the items can be stored in one of memory areas selected by the selection signal. That is, the selection signal can represent one or two classification items of a plurality of sets of data stored in the memory circuit. Then, it will be understood that a set of data comprises the classification items and a character to be stored at one character address in one memory area of the memory circuit. When the set of the data is stored in the memory circuit, the character is memorized as the memorized character in one memory area selected by the selection signal representative of the classification items. Accordingly, a plurality of sets of data having the same classification items are only memorized in the one memory area. Accordingly, when the classification items are input together with the input character for identification of the input character, the identification is carried out for the one memory area but need not be carried out for the other memory areas.

Figure 4:
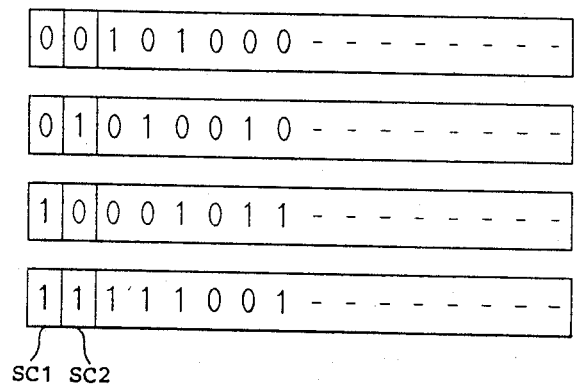
FIG. 4 is a view of an example of memorized characters stored in an associative memory circuit of the character identification device shown in FIG. 2 together with selection signals.

Referring to FIG. 4 in addition to FIG. 2, an example is illustrated in connection with four sets of data stored in the memory circuit each of which has two classification item codes assigned to the selection code bits SC1 and SC2 and the memorized character for the case (c). It should be noted that the selection code bits SC1 and SC2 are not memorized in any memory cells in the memory circuit 40 but indicate individual memory areas. Thus, it will be understood from different selection signals that the shown four memorized characters are memorized in the memory cells of different memory areas. For character identification, the classification items are supplied as the selection signal with the input character. The input character and the selection signal will be collectively called a retrieval data signal. With the retrieval data signal, selection of the memory areas is carried out by the selection signal included in the retrieval data signal. Identification of the input character of the retrieval data signal is carried out in the memory area selected by the selection signal. A result of identification is obtained from the priority encoder 50. Accordingly, a combination of the selection signal and the result of identification gives a result of retrieval.

In this case, the masking can not be carried out for the selection signal of the retrieval data signal. However, it is unusual that the masking occurs to any bit position in the retrieval data signal. Accordingly, a few bits in the retrieval data signal do not change. Therefore, it does not practically result in any trouble to assign any two of the few bits to the selection input signal. For example, it is assumed that the retrieval data signal includes a character code representative of a distinction between a member and an outsider as regards a person, the person's sex, the person's name, the person's native place, the person's position, and the person's age. In this case, the distinction and the sex will seldom become the object of masking. This is because it is of frequent occurrence to question the name, the position, and the age of a person whose native place is already known and who is the regular member and of the male sex. On the contrary, it is of little occurrence to question the sex and the distinction.

It is necessary to sequentially carry out the identification all over the memory areas if the retrieval must be carried out with masking of the selection signal. Accordingly, it is necessary to access the memory circuit 40 four times per one retrieval data signal. It will be assumed that one retrieval cycle time Tc is equal to 100 nsec and that the selection signal is masked with frequency of 1%. An average cycle time Ta for the retrieval is well approximated by:

$$Ta = 100 + (1/100) \times 400 = 104 \text{ nsec.}$$

Therefore, the average cycle time Ta does not become very long in comparison to the cycle time Tc.

It is preferred that the selection signal has an increased bit length. This is because the individual write-in circuit 68 and the individual read-out circuit 70 both connected to one bit line 62 can access an increased number of memory cells 64 so that the associative memory circuit 40 has a higher memory density. The memory density is also raised by the fact that two memory cells in one bit line in one memory matrix are assigned to one memory area so that one of the two memory cells stores a logic "0" level with the other storing a logic "1" level. Therefore, the higher memory density can be realized by increasing the number of memory cells without expansion, in size and number, of the priority encoder 50, the data decoder 66, and the address decoder 78 so that the chip size increases little with realization of the higher memory density. That is, assuming that the memory matrixes 58 lie over one-eighth the chip area, the size of the chip increases only twice by increasing a memory capacity of the memory matrixes 58 eight times.

At any rate, it is possible to increase the number of the memory areas without an increment of the size of the chip. In this case, the bit length of the selection signal is increased from two bits to, for example, three bits or four bits. There are actual items which can be assigned as data to the increased bits of the selection signal. Examples of such items are a data making date, a person's position and a person's name of the data maker. Thus, it is possible to retrieve the data with reference to the data, the position and the name.

Next, description will be made in connection with data bit number considered to be stored at a one address in the associative memory circuit. In case (c) of FIG. 3(c), it can apparently be seen that data having a bit length of (2+M) are stored in a one bit address in one memory area in view of the data bit arrangement in FIG. 4 although M bit data are actually stored in memory cells in the area. This means that the data bit number stored at a one bit address in the memory circuit is $2^2(M+2)=4(M+2)$ because the number of the memory areas is $2^2=4$.

On the other hand, no selection signal, but data input terminals (82, 83 in FIG. 2) are used in case (a) of FIG. 3(a). Data having $3M=(2+1)M$ are applied to the M pairs of data input terminals (81, 82, and 83 in FIG. 2) and are stored at a one bit address in the memory circuit.

Assuming $M=16$, the data bit number is $72=4(16+2)$ and $48=(2+1)16$ in case (c) and case (a), respectively. It will be understood that division of the memory circuit into a plurality of memory areas enables the device to apparently store an increased number of data bits in the memory circuit in comparison with use of the same memory circuit without division.

Assuming that the device is designed to use the selection signal having a bit length of B where B represents a predetermined number, it will be understood by similar consideration of case (c) that the number of the memory areas is represented by $2^B$ while data having a bit number of (M+B) are apparently stored in one of the memory areas. Accordingly, the bit number P of data apparently stored at a one bit address in the memory circuit is represented by $P=(M+B)2^B$.

It is natural that selection of an integer other than 2 for B requires change of the code bit number of the selection signal, a number of switches in each switch pair in the mode switch circuit (56 in FIG. 2), and a number of word lines (60 in FIG. 2) in each memory matrix (58 in FIG. 2).

On the other hand, when the device is used for storing data without use of the selection signal, input data terminals (such as 82 and 83 in FIG. 2) selected by the switch pairs in the mode switch circuit are changed in number so that the number of all of the input terminals (such as 81, 82, and 83 in FIG. 2) is M(B+1). This means that data bits of M(B+1) are stored at a one bit address in the same memory circuit.

Figure 5:
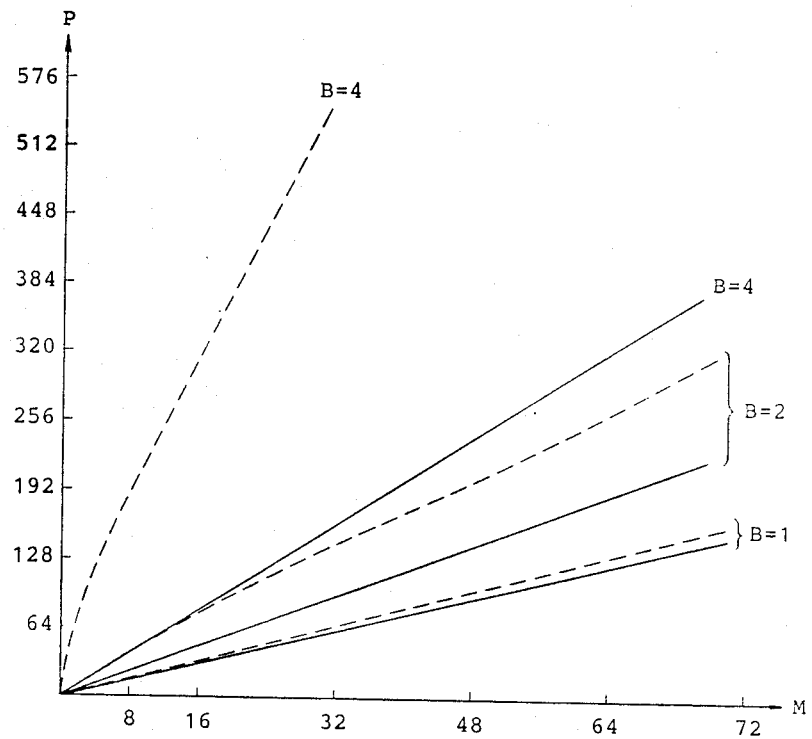
FIG. 5 shows a relationship between the number (M) of data decoders and the number (P) of bits of memorized characters with a parameter of the number (B) of bits of the selection signal.

Referring to FIG. 5, a relation is illustrated between a number (M) of the data decoders 66 and a number (P) of data bits stored at a one bit address in the memory circuit with a parameter of the selection signal code bit number B. In this figure, solid lines and broken lines represent case (a) where no selection signal is used and case (c) where a selection signal is used, respectively. FIG. 5 teaches us that case (c) is considerably preferable to case (a) with respect to number P when number B is equal to or larger than 2. Number P in case (c) is obviously larger than that in case (a) when number B is equal to 4 and when number M is a reduced value.

Now, description will be made in connection with an application of the character identification device in a semantic network. The semantic network uses a plurality of relation predicates each representing a relation or link between two objects or nodes. Some examples of the relation predicates are listed in FIG. 6 together with their meanings.

Referring to FIG. 6, a left column and a right column have relation predicates and meanings of the relation predicates, respectively. A first relation predicate "is-a" means that two nodes or subjective data piece A is, or is included in, complement data piece B. A second relation predicate "part-of" means that the data piece A is a part of the data piece B. Similarly, a third relation predicate "a-kind-of" means that the data piece A is a kind of the data piece B. A fourth relation predicate "instance-of" means that the data piece A is an instance of the data B.

Referring to FIG. 7, a list shown therein has the relation predicates in a left (a first) column, and has two nodes or subjective data and complement data to be linked by the relation predicates in an intermediate (a second) column and a right (a third) column, respectively.

In use of the character identification device for the semantic network using the list of FIG. 7, the associative memory circuit (40 in FIG. 2) preliminarily memorizes four data sets each comprising a relation predicate, subjective data, and complement data in one horizontal row in FIG. 7.

In general, retrieval of the semantic network is frequently carried out on the basis of the relation predicate. Therefore, the relation predicate is not usually masked. As a result, it is convenient to assign the relation predicate to code bits of the selection signal. For example, the relation predicates "is-a," "part-of," "a-kind-of," and "instance-of" are assigned to selection signals to select the first through the fourth memory areas 41 to 44, respectively. The subjective and the complementary data in one data set are memorized in one memory area indicated by the relation predicate in the same data set. Accordingly, it is possible to memorize the subjective and the complementary data equally in data set number in the first through the fourth memory areas 41 to 44.

The illustrated character identification device may be used in cooperation with a random access memory (not shown). The random access memory has an address input coupled to the priority encoder 50 and the selection output terminals 86 and 87. The random access memory has a data output coupled to the data input terminals 81. The random access memory is for preliminarily memorizing data such as "animal," "meat," "food," and so on.

In the character identification device in FIG. 2 storing the list in FIG. 7, identification is carried out for the first memory area 41 when the relation predicate "is-a" is supplied to the associative memory circuit 40 through the mode switch circuit 56 and the data decoders 66 as the selection signal. Simultaneously, the subjective data "human being" are supplied to the first memory area 41 as the input character, masking the memorized complement data. Then, the priority encoder 50 produces the identified code corresponding to the memorized subjective data "human being." Responsive to the identified code and the selection signal, the random access memory produces the complementary data "animal."

Similarly, the identification is carried out in the second memory area 42 when the relation predicate "part-of" is supplied to the associative memory circuit 40 through the mode switch circuit 56 and the data decoders 66 as the selection signal. Simultaneously, the complementary data "animal" are supplied to the second memory area 42 as the input character, masking the memorized subjective data. Then, the priority encoder 50 produces the identified code corresponding to the memorized complementary data "animal." Responsive to the identified address code and the selection signal, the random access memory produces the subjective data "meat."

Likewise, identification is carried out in the third memory area 43 when the relation predicate "a-kind-of" is supplied to the associative memory circuit 40 through the mode switch circuit 56 and the data decoders 66 as the selection signal. Simultaneously, the subjective data "meat" are supplied to the third memory area 43 as the input character, masking the memorized complementary data. Then, the priority encoder 50 produces the identified code corresponding to the memorized subjective data "meat." In response to the identified code and the selection signal, the random access memory produces the complementary data "food."

Finally, identification is carried out in the fourth memory area 44 when the relation predicate "instance-of" is supplied to the associative memory circuit 40 through the mode switch circuit 56 and the data decoders 66 as the selection signal. Simultaneously, the complementary data "food" are supplied to the fourth memory area 44 as the input character, masking the memorized subjective data. Then, the priority encoder 50 produces the identified code corresponding to the memorized complementary data "food." Using the identified code and the selection signal, the random access memory produces the subjective data "roast meat." As a result, it is possible to infer from the above fact that the human being turns into the roast meat under certain circumstances.

Although the horizontal and the longitudinal lines are called the bit and the word lines, respectively, the horizontal and the longitudinal lines may be called the word and the bit lines, respectively.

Figure 8:
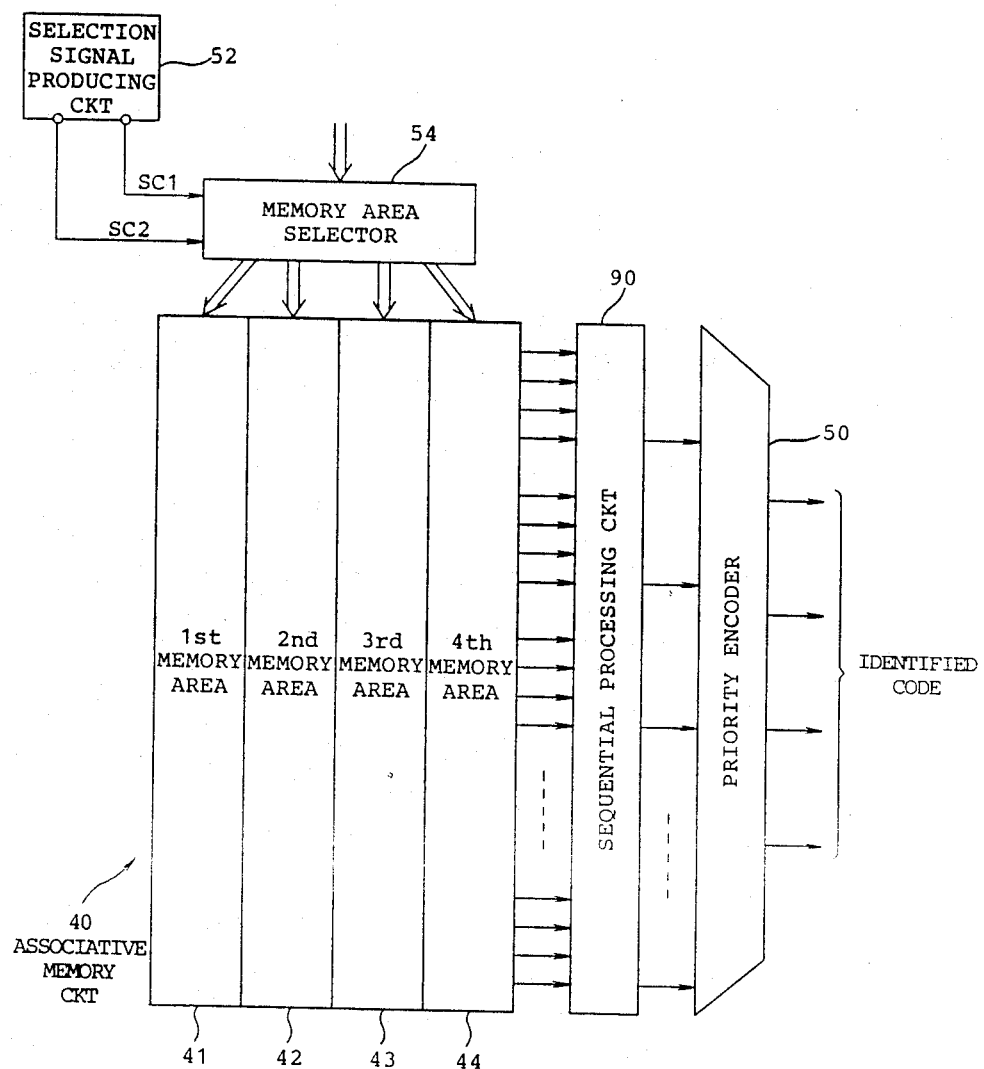
FIG. 8 is a block diagram of a character string identification device according to a third embodiment of the present invention.

Referring to FIG. 8, a character string identification device according to a third embodiment of the present invention is for identifying a sequence of input characters, namely, a character string to produce an identified code indicative of a result of identification.

The illustrated character string identification device is similar to the character string identification device illustrated in FIG. 1 except for a sequential processing circuit 90. The similar parts are represented by the same reference numerals as in FIG. 1 and description thereto is not repeated.

The sequential processing circuit 90 is coupled to the associative memory circuit 40 and to the priority encoder 50. The sequential processing circuit 90 is for sequentially processing the character match signals produced by the associative memory circuit 40 in response to the sequence of input characters into a string match signal. The priority encoder 50 encodes the string match signal into an encoded signal to produce the encoded signal as the identified code.

Figure 9:
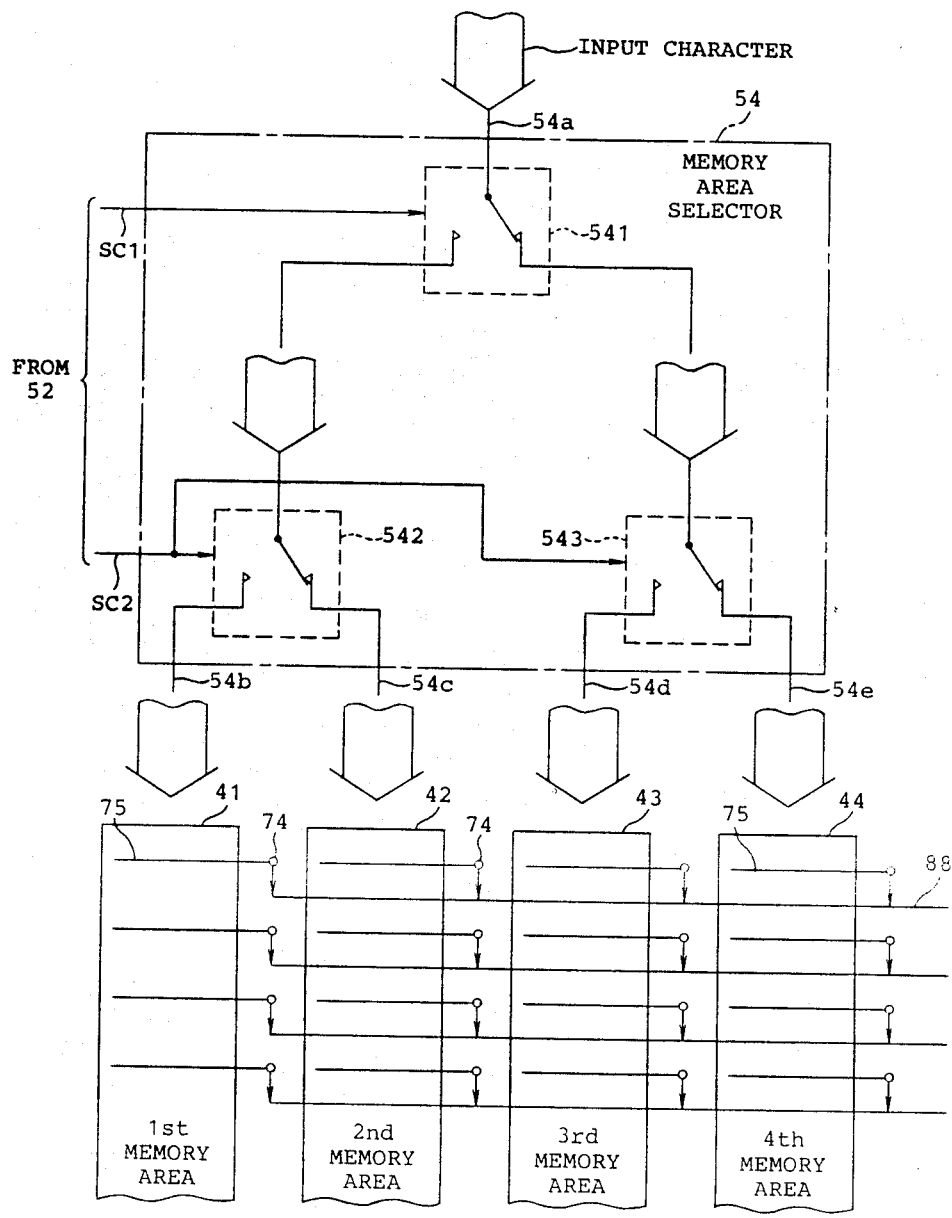
FIG. 9 is a block diagram of a memory area selector and an association memory circuit used in the character string identification device.

Referring to FIG. 9, the memory area selector 54 has an input terminal 54a and first through fourth output terminals 54b, 54c, 54d, and 54e and comprises first through third switches 541, 542, and 543. The input terminal 54a is connected to an input of the first switch 541 which has two outputs (on the left and the right) connected to inputs of the second and the third switches 542 and 543, respectively. The second switch 542 also has two outputs (on the left and the right) which are connected to the first and the second output terminals 54b and 54c, respectively, while the third switch 543 has two outputs (on the left and the right) which are connected to the third and the fourth output terminals 54d and 54e, respectively. The first through the fourth output terminals 54b, 54c, 54d, and 54e are connected to data input terminals of the first through the fourth memory areas 41 to 44, respectively.

The first switch 541 is controlled by the selection code bit SC1 while the second and the third switches 542 and 543 are controlled by the selection code bit SC2. More specifically, the first switch 541 selects the left hand output when the selection code bit SC1 takes a logic "0" level, while the first switch 541 selects the right hand output when the selection code SC1 takes a logic "1" level. Likewise, the second and the third switches 57 and 58 select the left hand outputs when the selection code SC2 takes a logic "0" level, while the second and the third switches 57 and 58 select the right hand outputs when the selection code SC2 takes a logic "1" level.

Therefore, each of the input characters is supplied to the first memory area 41 when both of the selection code bits SC1 and SC2 take the logic "0" level. Similarly, each of the input characters is supplied to the second memory area 42 when the selection code bits SC1 and SC2 take "0" and "1," respectively, while each of the input characters is supplied to the third memory area 43 when the selection code bits SC1 and SC2 take "1" and "0," respectively. Likewise, each of the input characters is supplied to the fourth memory area 44 when both of the selection code bits SC1 and SC2 take "1."

Figure 10:
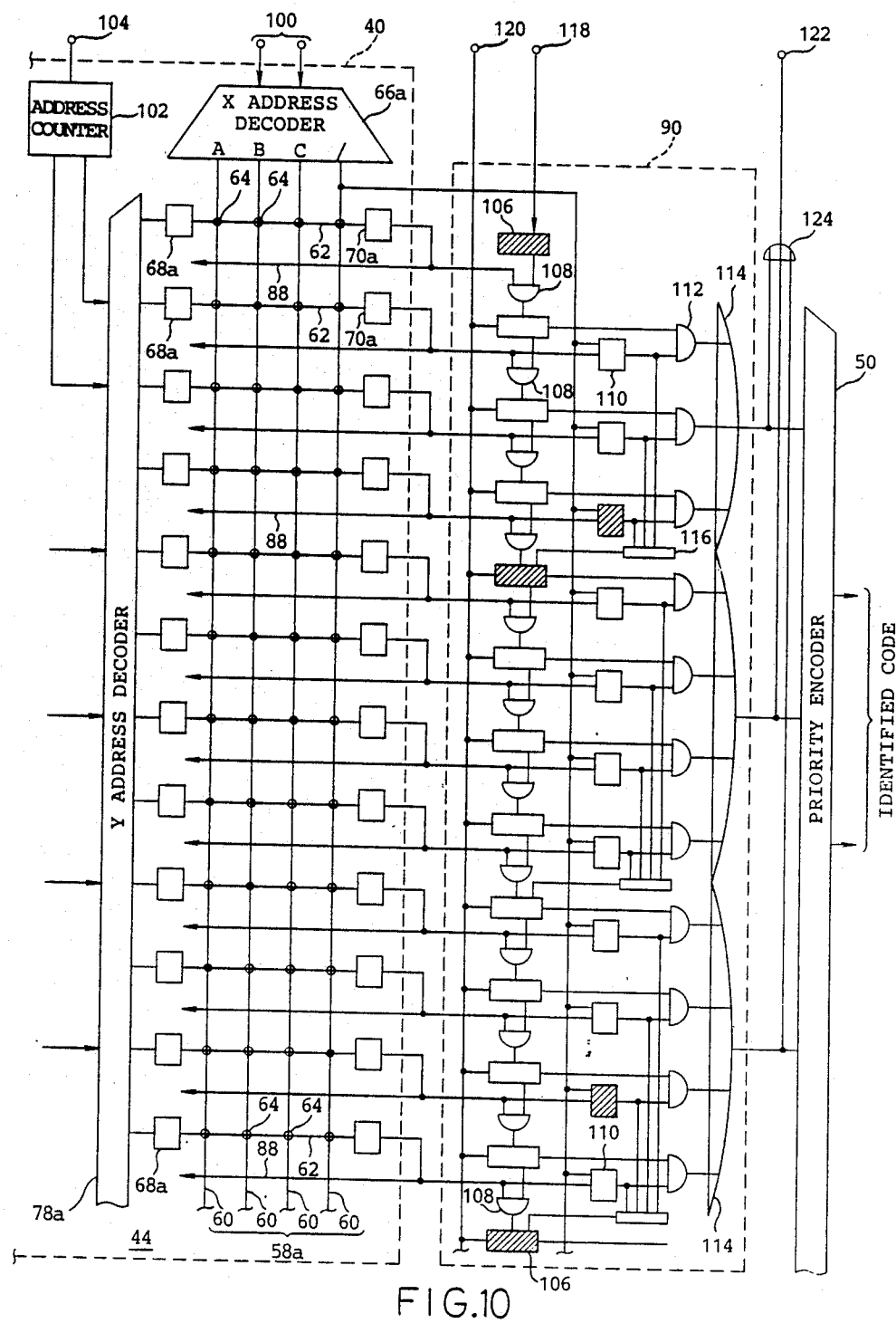
FIG. 10 is a block diagram of a memory area of the associative memory circuit and a sequential processing circuit used in the character string identification device.

Turning to FIG. 10, one of the first through the fourth memory areas 41 to 44, for example the fourth memory areas 44, comprises a random access memory (RAM) which is known in the art. The memory area 44 includes a memory matrix 58a similar to that illustrated in FIG. 2. The memory matrix 58a comprises four word lines 60, a plurality of bit lines 62, and a plurality of memory cells 64 arranged at points of intersection of the word lines 60 and the bit lines 62. The memory area 44 has an X address decoder 66a and a Y address decoder 78a similar to the data decoder 66 and the address decoder 78 illustrated in FIG. 2, respectively. The memory area 44 comprises write-in circuits 68a and read-out circuits 70a similar to the individual write-in circuits 68 and the individual read-out circuits 70, respectively. The write-in circuits 68a are coupled to the bit lines 62, respectively, and the read-out circuits 70a are also coupled to the bit lines 62, respectively. The write-in circuits 68a are coupled to the Y address decoder 78a, while the read-out circuits 70a are coupled to wired OR lines 88, respectively. The wired OR lines 88 are coupled to the sequential processing circuit 90.

In the embodiment of FIGS. 8-10, each of the first through fourth memory areas 41 through 44 is provided with the Y address decoder 78a for driving the write-in circuits 68a, which is different from the embodiment of FIG. 2. The wired OR lines 88 are used for commonly coupling the read-out circuits 70a in all of the memory areas to the sequential processing circuit 90 for each bit line 60. Accordingly, wired OR lines 88 extend to the other memory areas as shown by arrows at left hand ends of the lines 88 in FIG. 10.

The X address decoder 66a has two input terminals 100 connected to the memory area selector 54. The X address decoder 66a selects a particular one of the word lines 60 in response to each input character supplied from the input terminals 100 through the memory area selector 54. The Y address decoder 78a decodes a storage address code into a decoded signal indicative of a particular one of the write-in circuits 68a to make the particular write-in circuit 68a produce a write indication signal.

In FIG. 10, it should be noted that the logic "1" level is written in only one of four memory cells 64 coupled to each bit line 62 as shown at a black spot in FIG. 10. Memory cells storing logic "0" level are depicted by white spots. Each of read-out circuits 70a reads the content of that memory cell 64 which is coupled to the particular word line 60 selected by the X address decoder 66a.

It is assumed that each input character has a character code which is two bits in length and the input characters are only four characters "A," "B," "C," and "/." The storage address code is representative of one of the Y or bit addresses, that is, memory locations for memorized characters which will be referred to as character addresses. The storage address code comprises a high order address code and a low order address code. The high order address code indicates a string address. The low order address code indicates a particular one of the character addresses in the string address. The low order address code is supplied from an address counter 102. The address counter 102 is for counting clock pulses supplied from a clock input terminal 104 to produce a count as the low order address code.

Before the character strings are stored in the fourth memory area 44 as memorized character strings, the fourth memory area 44 is cleared so that all memory cells 64 take the logic "0" level.

The following example involves storing two character strings "ABC" and "CBCABA," namely, a sequence of characters "ABC/CBCABA/" in the fourth memory area 44. The high order address code is supplied to the Y address decoder 78a to indicate the string address. On the other hand, characters of the character string are successively supplied to the X address decoder 66a in synchronism with shift clock pulses. In response to the shift clock pulses, the low order address codes are supplied to the Y address decoder 78a from the counter 102. Therefore, the sequence of characters "ABC/CBCABA/" are successively stored in memory cells on a first one through an eleventh one of the bit lines 62 by the write-in circuits 68a connected thereto, respectively. A first one through an eleventh one of the characters are representative of "A," "B," "C," "/," "C," "B," "C," "A," "B," "A," and "/," respectively.

More specifically, storing of the first character "A" is carried out by writing a logic "1" level in one of the memory cells 64 that is coupled to a particular one (a first one in this embodiment) of the word lines 64, namely, a left column and to the first bit line 62, namely, an upper row. Similarly, storing of the second character "B" is carried out by writing a logic "1" level in another one of the memory cells 64 that is coupled to a second one of the word lines 64 and to the second bit line 62. Storing of the remaining characters is similarly carried out. Thus, the sequence of characters are stored in the memory area 44 as the memorized characters.

Now, description is made as to character matching process of an input character to the memory area 44.

When the input character, for example, "A" is supplied to the X address decoder 66a, the first word line 60 is put into an active state. The first word line 60 is connected to first cells of the memory cells 64 in respective bit lines 62. Each of the first memory cells is loaded with a logic "1" level or a logic "0" level as mentioned before. The first memory cells of the logic "1" level will be called particular cells. When the first word line is put into the active state, the particular memory cells produce the logic "1" level through the read-out circuits 70a as the character match signal.

Therefore, the character match signal is produced by the read-out circuits 70a connected to the first, the eighth, and the tenth bit lines 62 in response to the input character of "A." In a similar manner, the character match signal is produced by the read-out circuits 70a connected to the second, the sixth, and the ninth bit lines 62 in response to the input character of "B." Similarly, the character match signal is produced by the read-out circuits 70a connected to the third and the fifth bit lines 62 in response to the input character of "C." When the input character is "/," the read-out circuits 70a connected to the fourth and the eleventh bit lines 62 similarly produce the character match signal, too. The input character of "/" is representative of a delimiter of the character string.

The illustrated sequential processing circuit 90 comprises a plurality of flip flops 106 and a plurality of AND gates 108. The AND gates 108 are equal in number to the bit lines 62, and have individual first input terminals connected to the wired OR lines 88, respectively. The number of the flip flops 106 is larger by one than that of the AND gates 108. Each of the AND gates 108 has a second input terminal connected to an output terminal of one of the flip flops 106 and has an output terminal connected to an input terminal of another of the flip flops 106 so that the flip flops 106 and the AND gates 108 are alternately connected in cascade.

It will be understood that the cascade connection of the flip flops 106 and the AND gate 108 is corresponding to a state transition diagram which is well known and used for describing an operation state of an automaton. The state transition diagram comprises a plurality of state nodes and a plurality of paths for connecting the state nodes. More specifically, each of the state nodes indicates a state which changes in response to a character. Each of the paths indicates a transition from a state to another state. It is understood that the flip flops 106 correspond to the state nodes while the AND gates 108 correspond to the paths.

In order to check up the character strings having various character lengths, the sequential processing circuit 90 further comprises a plurality of registers 110. Each of registers 110 is for holding a delimiter signal representative of the delimiter. Each of registers 110 has an input terminal coupled to the fourth word line 60 to receive the delimiter signal and another input terminal coupled to one of the wired OR lines 88. The delimiter is held in a selected one or more of the registers 110.

Storing operation of the delimiter signal is carried out in the manner which will be described below. The character of "/" is supplied to the X address decoder 66a after the sequence of the characters "ABC/CBCABA/" is stored in the fourth memory area 44. In response to the character of "/" supplied to the X address decoder 66a, the fourth word line 60 is put into an active state. The fourth word line 60 is connected to fourth cells of the memory cells 64. The fourth memory cells of the logic "1" level will be called specific memory cells. The specific memory cells produce the logic "1" level through the read-out circuits 70a onto the wired OR lines connected thereto when the fourth word line is put into the active state. The logic "1" level produced by the specific memory cells is applied and held, as the delimiter signal, in specific registers of the registers 110 which are connected to the specific memory cells through the read-out circuits 70a and the wired OR lines 88.

Therefore, the delimiter signal is held in the specific registers connected to the specific memory cells which are connected to the fourth and the eleventh bit lines. The specific registers are illustrated in shaded blocks as shown in FIG. 10.

Each of the registers 110 has an output connected to an input of one of AND gates 112. Each of the AND gates 112 has another input connected to another output of one of the flip flops 106 as shown in the figure. Each of the AND gates 112 has an output connected to the priority encoder 50 through one of OR gates 114. The OR gates 114 are equal in number to one-fourth of the number of the bit lines. The output of each register 110 is also connected to one of the flip flops 106 through one of OR gates 116 as shown in the figure. The OR gates 116 are equal in number to the OR gates 114. Specific ones of the flip flops 106 are connected to the specific registers through the OR gates 116 and are loaded with a logic "1" level. The specific flip flops 106 are illustrated as shaded blocks in FIG. 10. On the other hand, a first stage flip flop in the cascade connection is also loaded with a logic "1" level through an input terminal 118 connected thereto. The first flip flop is also illustrated as a shaded block in FIG. 10. Accordingly, the sequential processing circuit 90 can check up the character strings having various character lengths, as will later be described.

An input terminal 120 is provided with shift clock pulses and a reset pulse to all of the flip flops 106. The OR gates 114 have outputs connected to an output terminal 122 through an OR gate 124.

Description will be made in connection with an operation of identification of the input character string. It will be assumed that the character string "ABC" is supplied to the fourth memory area 44 through the memory area selector 54 (FIG. 8 and FIG. 9) as the input character string. When a first character "A" of the input character string "ABC" is supplied to the X address decoder 66a, the character match signal is delivered from a first one, an eighth one, and a tenth one of the read-out circuits 70a to a first one, an eighth one, and a tenth one of the AND gates 108 as mentioned before. The first stage flip flop 106 is loaded with the logic "1" level but an eighth one and a tenth one of the flip flops 106 are maintained to a logic "0" level. Therefore, the logic "1" level is shifted from the first stage flip flop 106 to a second one of the flip flops 106 through the first AND gate 108 in synchronism with the shift clock pulse. Accordingly, the logic "1" level is set in the second flip flop 106.

Similarly, the character match signal is also delivered from a second one, a sixth one, and a ninth one of the read-out circuits 70a to a second one, a sixth one, and a ninth one of the AND gates 108 when a second character "B" of the input character string "ABC" is supplied to the X address decoder 66a. The logic "1" level is shifted from the second flip flop 106 to a third one of the flip flops 106 through the second AND gate 108 in synchronism with the shift clock pulse. Accordingly, the logic "1" level is set in the third flip flop 106.

Likewise, a third, a fifth one, and a seventh one of the read-out circuits 70a delivers the character match signal to a third one, a fifth one, and a seventh one of the AND gates 108 when a third character "C" of the input character string "ABC" is supplied to the X address decoder 66a. The logic "1" level is, then, shifted from the third flip flop 106 to a fourth one of the flip flops 106 through the third AND gate 108 in synchronism with the shift clock pulse. Accordingly, the logic "1" level is set in the fourth flip flop 106. Since a third one of the registers 110 is the specific register holding the logic "1" level, the logic "1" level is delivered through one of the AND gates 100 and one of the OR gates 114 to the priority encoder 50 as the string match signal. The string match signal is sent to the output terminal 122 through the OR gate 124.

The memory area 44 has a number of word lines 60 which are equal to that of the memory cells 64 arranged along each bit line 62. In this embodiment, the word lines 60 are equal in number to four (4) because the input character has a two-bit length. However, the memory area should be made to have word lines 60 which are equal in number to 16, 256, and 65,536, when the input character has a bit length of 4, 8, and 16 bits, respectively. Moreover, the logic "1" level is stored in only one of a plurality of memory cells 64 arranged along each bit line 62 for memorizing one character. This means that efficiency is low in utilization of the memory cells 64 when the input character has a higher bit length. For example, the memory cell utilization efficiency is 8/258 or about 0.003, when the input character has a bit length of 8 bits.

Figure 11:
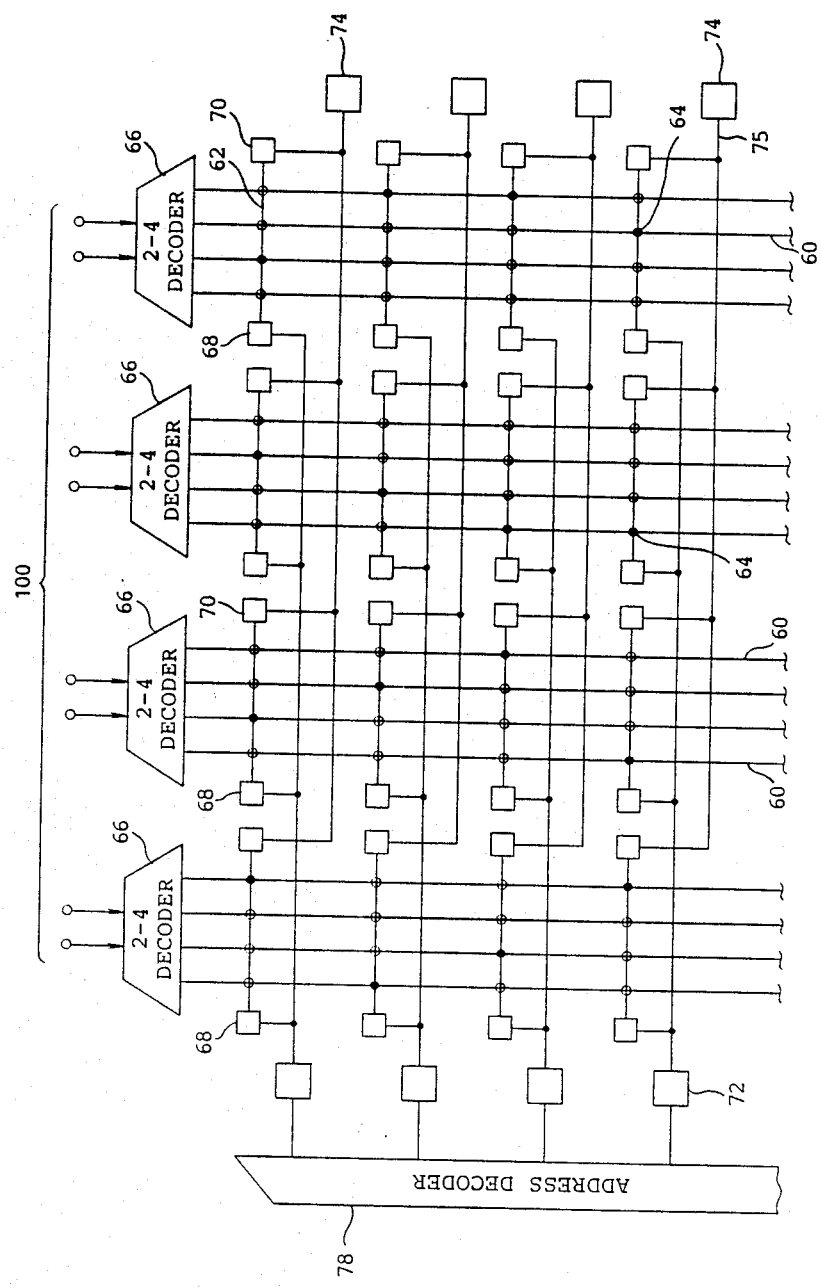
FIG. 11 is a block diagram of another memory area of the associative memory circuit.
Figure 12:
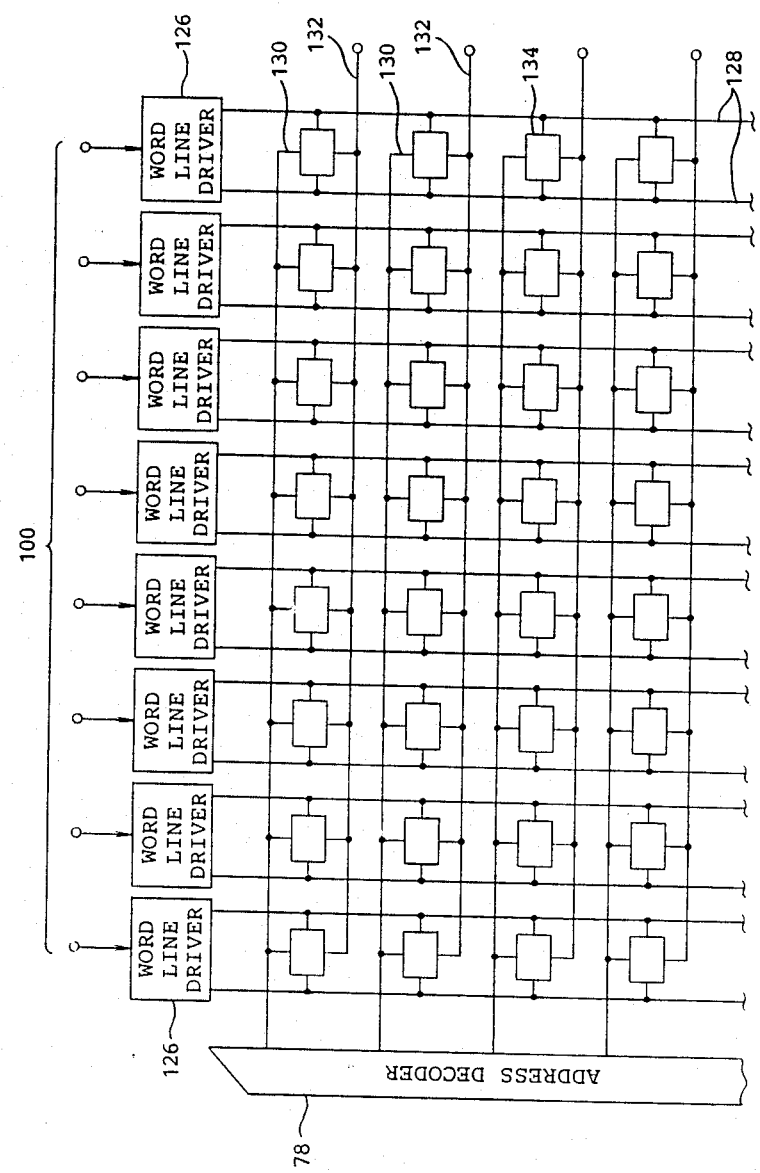
FIG. 12 is a block diagram of another memory area of the associative memory circuit.

In order to improve the memory cell utilization efficiency for the input character having a longer bit length such as an eight-bit length, memory constructions as shown in FIGS. 11 and 12 are preferred.

Referring to FIG. 11, another memory area is similar to a combination of the memory circuit 40 and the decoders in the character identification device 40 illustrated in FIG. 2. The data decoders 66 are equal in number to four. Each of the decoders 66 is a 2 bit to 4 bit decoder. The decoders 66 are provided with the input character of 8 bits through the memory area selector 54 (FIG. 9).

With this structure, the memory area has a memory cell utilization efficiency equal to 0.5, although the input character has an eight-bit length. More specifically, the memory cells 64 arranged along each bit line 62 are equal in number to 16 when four 2 bit to 4 bit data decoders are used for the input character of 8 bits. In comparison with this, a memory area has two hundred fifty-six memory cells 64 along each bit line 62 when a single 8 bit to 256 bit data decoder is used for the input character of 8 bits. Therefore, the memory area of FIG. 11 is preferred in size for processing characters each having a long bit length.

In order to indicate use of the memory area of FIG. 11 for each of the first through fourth memory areas 41 through 44, wired AND lines 75 are drawn in FIG. 9.

Referring to FIG. 12, another memory area comprises a plurality of word line drivers 126 each of which is provided with one bit of the input character. Each of the word line drivers 126 is for driving a pair of word lines 128. The address decoder 78 is coupled to a plurality of bit lines 130 for selecting an address. The address decoder 78 is for selecting one of the bit lines 130 in response to the storage address code. The memory area is provided with a plurality of sense lines 132 for detecting the character matching. The sense lines 132 are arranged along the bit lines 130 and are equal in number to the bit lines 130. The memory area comprises a plurality of associative memory cells 134. Each of the memory cells 134 is connected to one of the bit lines 130, to one of the sense lines 132, and to the pair of word lines 128. On storing the sequence of the characters, each of the characters is stored, as the memorized character, in the associative memory cells 134 arranged along one of the bit lines 130 that is selected by the address decoder 78. On detecting character matching, the character match signal is produced through one of the sense lines 132 which is connected to the associative memory cells 134 storing the memorized character coincident to the input character applied through the input terminal 101.

This memory area structure has memory cell utilization efficiency equal to one. As a result, the memory area has a reduced size for characters each having a long bit length.

Figure 13:
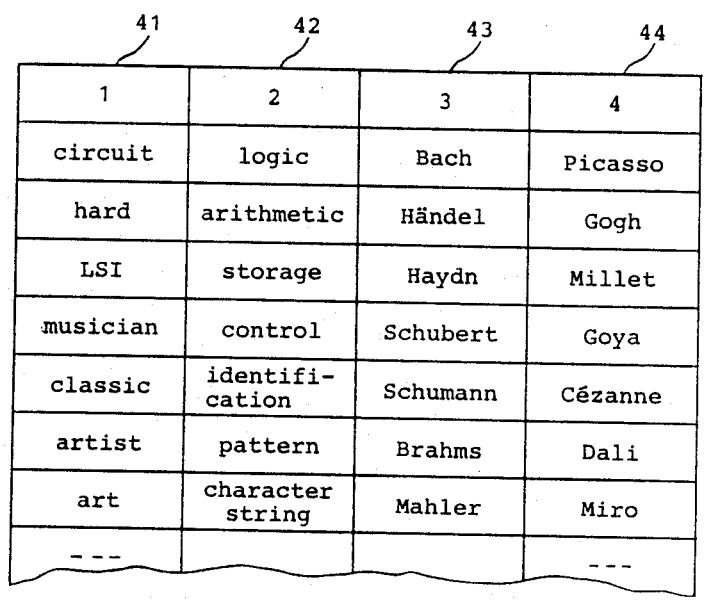
FIG. 13 is a view of an example of memorized characters stored in memory areas of the associative memory circuit.

Referring to FIG. 13, an example is illustrated for the memorized character strings memorized in the first through the fourth memory areas 41 to 44 of the associative memory circuit 40 in FIG. 8. A first row represents the number of the memory area. More specifically, "1," "2," "3," and "4" represented in the first row correspond to the first through the fourth memory areas 41 to 44, respectively. The examples of the memorized character strings are illustrated in the rows below the first row. Keywords to be stored as the memorized character strings are classified into four subkeywords, namely, a first, a second, a third, and a fourth subkeywords. The first subkeywords are general terms used in a wide domain or field. As such general terms, "circuit," "musician," "artist," and so on are listed in the figure. The second subkeywords are terms, for example, "logic," "arithmetic," "storage," and so on used in relation to information processing devices. The third subkeywords relate to musicians such as "Bach," "Händel," "Haydn," and so on. The fourth subkeywords are directed to artists such as "Picasso," "Gogh," "Millet," and so on. A first column or the first memory area 41 stores the first subkeywords as the memorized character strings, while a second column or the second memory area 42 stores the second subkeywords as the memorized character strings. Likewise, a third column or the third memory area 43 stores the third subkeywords as the memorized character strings, while a fourth column or the fourth memory area 44 stores the fourth subkeywords as the memorized character strings.

On the identification, the first memory area 41 (the first column) is selected and the identification is carried out for the first subkeywords. It is assumed that the string match signal corresponding to "musician" or "classic" occurs. In this case, the third memory area 43 (the third column) is selected and the identification is carried out for the third subkeywords. Accordingly, information retrieval (identification) is closely or finely carried out by using the third subkeywords stored in the third memory areas 43.

Another subkeywords, for example, relating to biochemistry may be stored in the first column (the first memory area 41) as the first subkeywords if it is desired. After the information retrieval is carried out for the subkeywords relating to the biochemistry stored in the first memory area 41, the information retrieval is carried out for the third column to search an artist or artists taking an interest in biochemistry.

Figure 14:
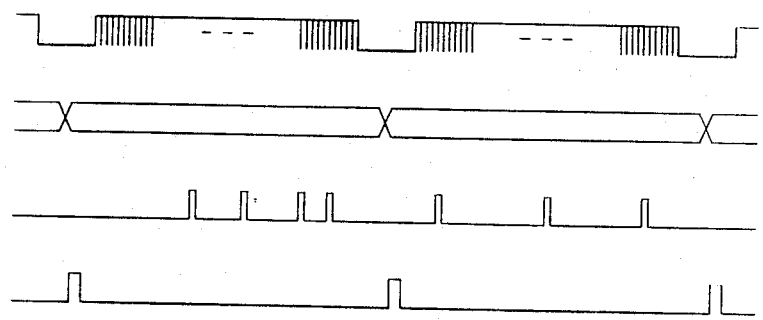
FIG. 14 is a time chart for use in describing operation of the character string identification device.

Referring to FIG. 14, an operation is schematically illustrated for character string identification requiring change of the memory areas. A first or upper row indicates two burst signals each including input clock pulses (shift clock pulses) in synchronism with the input character strings. A second row represents a time instant when the selection signal is changed. Changing of the selection signal is carried out during an interval between a burst signal of the input clock pulses and the next succeeding burst signal of the input clock pulses. A third row indicates a sequence of pulses each of which is representative of the string match signal. A fourth row represents reset pulses each of which resets all of the flip flops 106 of the sequential processing circuit 90 after one of the memory areas is selected by the selection signal. Use of the reset pulses prevents any error of the identification from occurring when the memory areas are changed.

Figure 15:
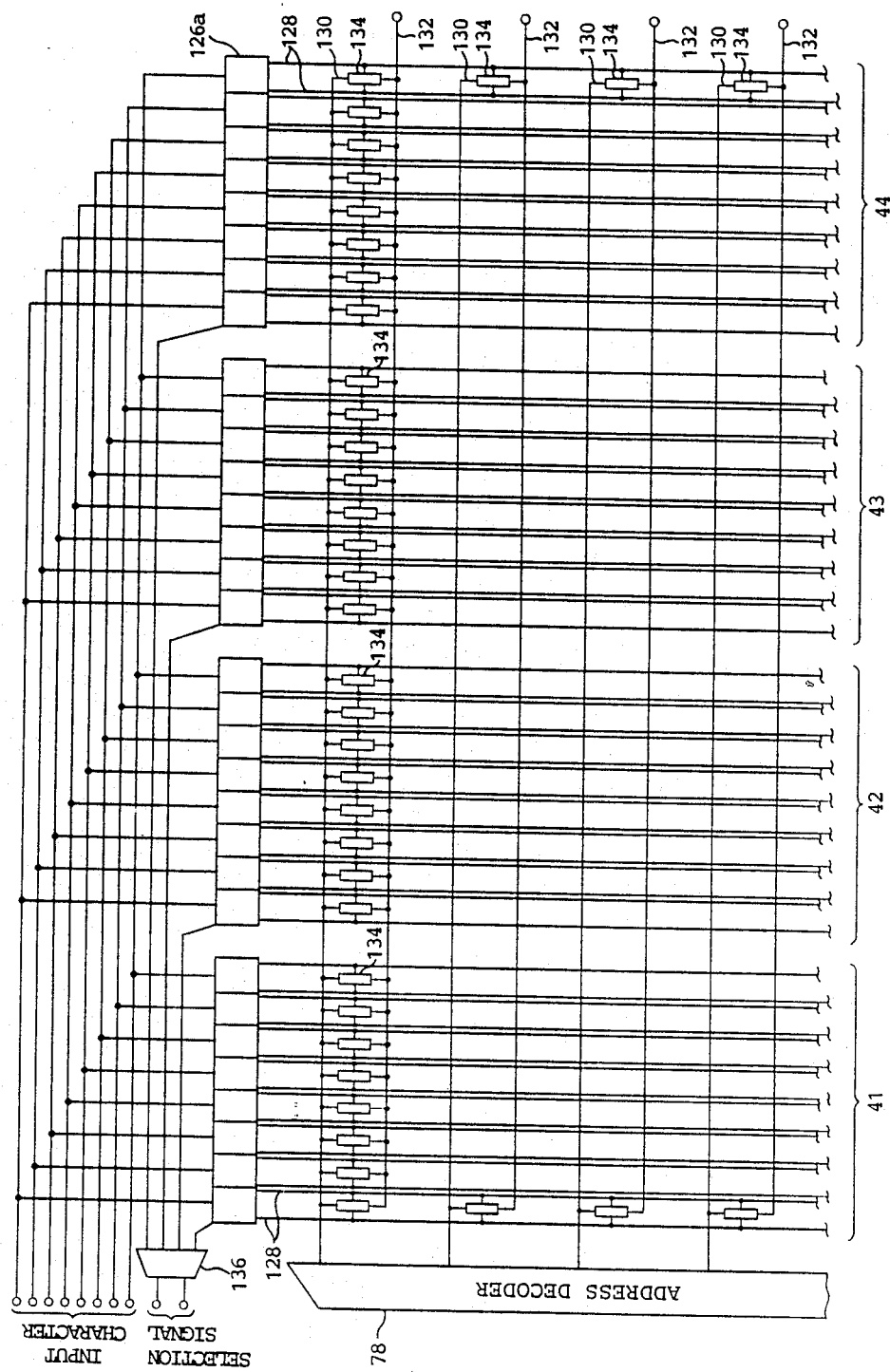
FIG. 15 is a block diagram of another associative memory circuit used in the character string identification device.

Referring to FIG. 15, another example of the associative memory circuit 40 is similar to the memory area illustrated in FIG. 12 except that the circuit comprises four memory areas 41 through 44 and four sets of word line drivers 126a with switches. Although the memory cells 134 are provided at all cross points of the paired word lines 128 and the bit and sense lines 130–132, some of the memory cells are shown but the remaining ones are omitted for the purpose of simplification of the drawing. A decoder 136 decodes the selection signal into a decoded signal indicative of one of the sets of word line drivers 126a as a selected set of word line drivers 126a. When the decoded signal is supplied to the selected set of word line drivers 126a, the selected set of word line drivers 126a is put into an active state to supply each input character to a specific one of the memory areas. Therefore, a combination of the decoder 136 and the four sets of word line drivers 126a acts as the supplying arrangement.

Figure 16:
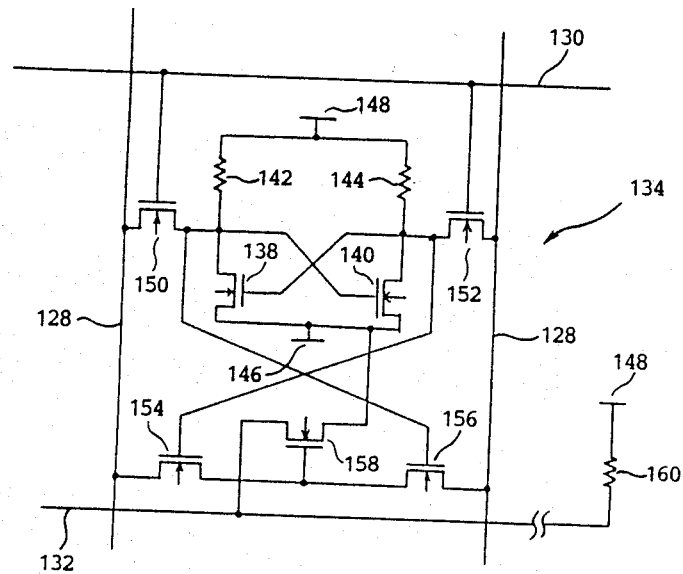
FIG. 16 is a circuit diagram of an associative memory cell used in the memory area shown in FIG. 12 and in the associative memory circuit shown in FIG. 15.

Referring to FIG. 16, the associative memory cell 134 includes a SRAM cell which comprises first and second metal oxide semiconductor (MOS) transistors 138 and 140 and first and second resistors 142 and 144. The first MOS transistor 138 has a gate connected to a drain of the second MOS transistor 140 which has a gate connected to a drain of the first MOS transistor 138. The first and the second MOS transistors 138 and 140 have sources which are commonly connected to a first power terminal 146. The drain of the first MOS transistor 138 is connected to a second power terminal 148 through the first resistor 142, while the drain of the second MOS transistor 140 is connected to the second power terminal 148 through the second resistor 144. The SRAM cell is for storing one bit which is either a logic "1" level or a logic "0" level as a stored bit.

The drain of the first MOS transistor 138 is further connected to a first one of the pair of the word lines 128 through a third MOS transistor 150 while the drain of the second MOS transistor 140 is further connected to a second one of the pair of the word lines 128 through a fourth MOS transistor 152. The third and the fourth MOS transistor 150 and 152 have bases connected to the bit line 130. When the third and the fourth MOS transistors 150 and 152 are selected by the address decoder 78 through the bit line 130, one bit supplied from the pair of the word lines 128 is stored in the SRAM cell as the stored bit.

The first word line 128 is connected to the second word line 128 through fifth and sixth MOS transistors 154 and 156. The fifth MOS transistor 154 has a base connected to the drain of the second MOS transistor 140 while the sixth MOS transistor 156 has a base connected to the drain of the first MOS transistor 138. When one bit is supplied from the pair of the word lines 128 as a retrieval bit, comparison between the retrieval bit and the stored bit is carried out by the fifth and the sixth MOS transistors 154 and 156.

The first power terminal 146 is connected to the sense line 132 through a seventh MOS transistor 158 which has a base connected to a point of connection between the fifth and the sixth MOS transistors 154 and 156. In order to retrieve a plurality of retrieval bits, associative memory cells 134 are arranged along the bit line 130 and the sense line 132 as illustrated in FIGS. 12 and 15. A result of comparison by each associative memory cell 134 is delivered to the sense line 132 through the seventh MOS transistor 158. When the comparison results in matching, the base of the seventh MOS transistor 158 has a low potential so that the seventh MOS transistor 158 is put into a non-conductive state. Accordingly, the sense line 132 is provided with a high potential through a third resistor 160 for precharge and has a high potential. Otherwise, the seventh MOS transistor 158 is put into a conductive state so that the sense line 132 has a low potential.

Figure 17:
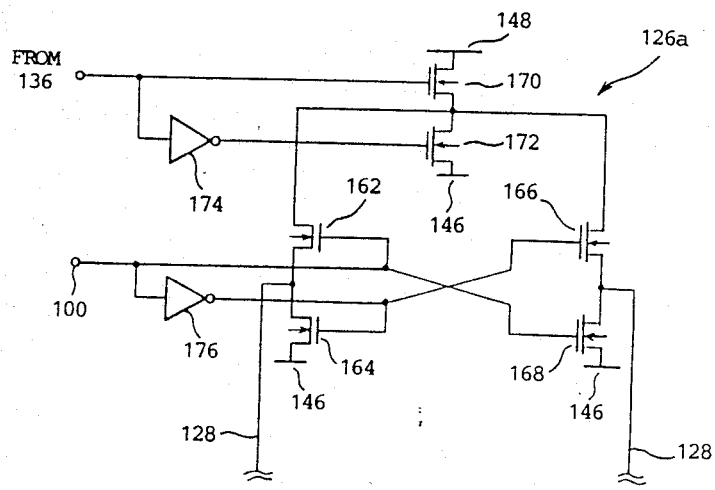
FIG. 17 is a circuit diagram of a word line driver used in the associative memory circuit shown in FIG. 15.

Referring to FIG. 17, the word line driver 126a comprises eighth through eleventh MOS transistors 162, 164, 166, and 168. The eighth MOS transistor 162 has a source connected to a drain of the ninth MOS transistor 164 which has a source connected to the first power terminal 146. Similarly, the tenth MOS transistor 166 has a source connected to a drain of the eleventh MOS transistor 168 which has a source connected to the first power terminal 146. The eighth MOS transistor 162 has a base connected to a base of the eleventh MOS transistor 168, while the ninth MOS transistor 164 has a base connected to a base of the tenth MOS transistor 166. The source of the eighth MOS transistor 162 is connected to the first word line 128 while the source of the tenth MOS transistor 166 is connected to the second word line 128.

The word line driver 126a further comprises a selection switch which comprises twelfth and thirteenth MOS transistors 170 and 172. The twelfth MOS transistor 170 has a drain connected to the second power terminal 148, while the thirteenth MOS transistor 172 has a source connected to the first terminal 146. The twelfth MOS transistor 170 has a source connected to a drain of the thirteenth MOS transistor 172. The source of the twelfth MOS transistor 170 (the drain of the thirteenth MOS transistor 172) is connected to drains of the eighth and the tenth MOS transistors 162 and 166. The twelfth MOS transistor 170 has a base which receives the decoded signal supplied from the decoder 136 (FIG. 15). On the other hand, the thirteenth MOS transistor 172 has a base which receives the decoded signal through a first inverter 174.

The bases of the eighth and the eleventh MOS transistor 162 and 168 are provided with a specific bit of each input character supplied from the input terminal 100. On the other hand, the bases of the ninth and the tenth MOS transistor 164 and 166 are supplied with the specific bit through a second inverter 176.

Description will be made of operation of the word line driver 126a. When the decoded signal takes a logic "1" level, the twelfth and thirteenth MOS transistors 170 and 172 are put into the conductive and the non-conductive states, respectively. Accordingly, the word line driver 126a is put into the active state because the drains of the eighth and the tenth MOS transistors 162 and 166 have a high potential. In this case, the first and the second word lines 128 have a high and a low potential, respectively, when the specific bit takes a logic "1" level. On the other hand, the first and the second word lines 128 have a low and a high potential, respectively, when the specific bit takes a logic "0" level.

When the decoded signal takes a logic "0" level, the twelfth and thirteenth MOS transistors 170 and 172 are put into the non-conductive and the conductive states, respectively. Accordingly, the word line driver 126a is put into an inactive state because the drains of the eighth and the tenth MOS transistors 162 and 166 have a low potential. In this case, both of the first and the second word lines 128 have a low potential in no relation to whether the specific bit takes the logic "0" level or the logic "1" level.

When the word line driver 126a is put into the active state, the associative memory cell 134 (FIG. 16) connected thereto through the pair of word lines 128 delivers the result of comparison between the stored bit and the retrieval bit to the sense line 160 (FIG. 16) as mentioned before.

A specific one of the first through the fourth memory areas 41 to 44 is selected by the selection signal as mentioned before. Therefore, the specific memory area will be called a selected memory area and the remaining areas, except the specific memory area, will be named nonselected memory areas.

In nonselected memory areas, the pair of word lines 128 has a low potential because the word line drivers connected to the nonselected memory areas are put into the inactive state. When the pair of word lines 128 has a low potential, the associative memory cell 134 connected thereto delivers a logic "1" level to the sense line 132. This is because the seventh MOS transistor 158 in the associative memory cell 134 has a base of a low potential and is put into the non-conductive state. Therefore, the sense line 132 is commonly used by all of the memory areas as shown in FIG. 15.

Figure 18:
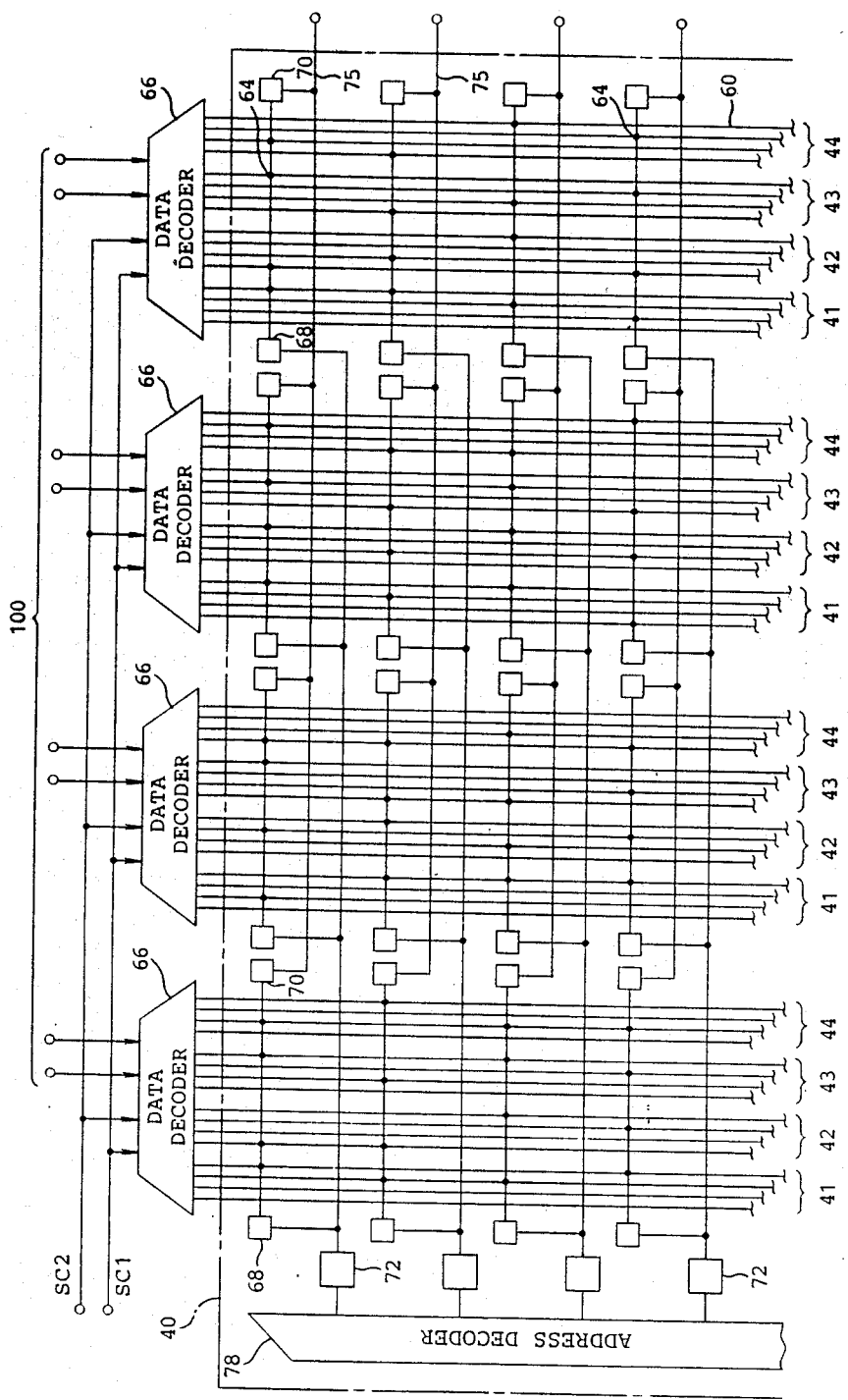
FIG. 18 is a block diagram of another associative memory circuit used in the character string identification device.

Referring to FIG. 18, another example of the associative memory circuit 40 shown therein is similar to that illustrated in FIG. 2 except that the word lines 60 connected to one of the data decoders 66 are equal in number to sixteen and the selection signal is directly supplied to the data decoders 66.

Figure 19A:
FIG. 19 is a view for use in describing a merit of this invention.
Figure 19B:
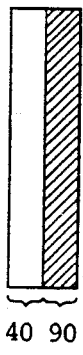

Referring to FIG. 19, a comparison is illustrated in connection with territories of the memory circuit 40 and the sequential processing circuit 90 on a surface of one semiconductor chip.

According to the prior art, the territory of the memory circuit 40 is approximately equal to the territory of the sequential processing circuit 90. If the sequential processing circuit 90 has a high grade function, the sequential processing circuit 90 will have a larger territory than that of the memory circuit 40. When the memory capacity is enlarged so as to increase characters to be stored in the memory circuit, the memory circuit 40 has an increased size in the word line direction, as shown at FIG. 19. This means that the sequential processing circuit 90 is also extended in the same direction. Accordingly, no change is generated with respect to the ratio of the territories of the memory circuit 40 and the sequential processing circuit 90.

Figure 19C:
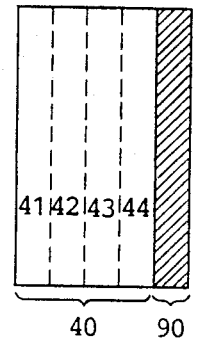

According to the present invention, the memory circuit 40 comprises a plurality of memory areas such as 41, 42, 43 and 44 each storing characters. The sequential processing circuit 90 is commonly used for identification of the string matching of the characters stored in any one of the plurality of memory areas. Accordingly, the territory of the memory circuit 40 larger than that of the sequential processing circuit 90 as shown in FIG. 19(c). This means that it is possible to increase the memory capacity without increase of the size of the sequential processing circuit 90.

Figure 20:
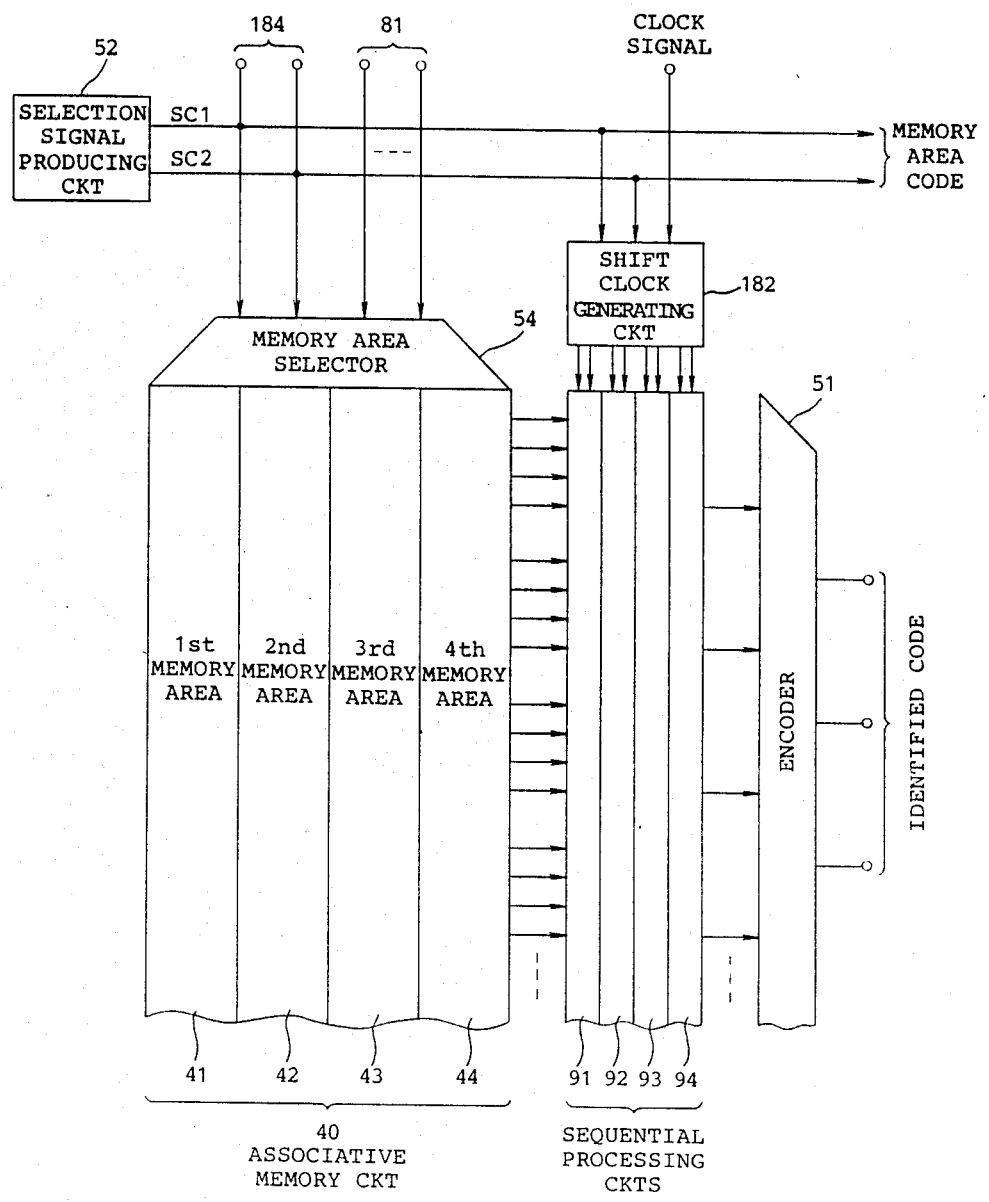
FIG. 20 is a block diagram of a character string identification device according to a fourth embodiment of the present invention.

Referring to FIG. 20, another character string identification device according to fourth embodiment of the present invention shown therein is provided with a plurality of sequential processing circuits shown at 91 through 94, respectively, in comparison with the embodiment of FIG. 8 having a single sequential processing circuit 90. That is, the device comprises a memory circuit 40, a selection signal producing circuit 52, data input terminals 81, and a memory area selector 54 which are similar to those in FIG. 1, and the sequential processing circuits 91 through 94 are coupled to outputs of first through fourth memory areas 41 through 44, respectively. Outputs from the sequential processing circuits 91 through 94 are coupled to an encoder 51 which includes a priority encoder similar to that in FIGS. 1 and 8.

The device further comprises a shift clock generating circuit 182. The shift clock generating circuit 182 is responsive to a clock signal and the selection signal from the selection signal producing circuit 52 and generates a shift clock signal for controlling operation of the sequential processing circuits 91 through 94. A plurality of selection signal input terminals 184 are provided to the device for receiving an external selection signal from an external device (not shown). The external selection signal is used in place of the selection signal from the selection signal producing circuit 52 when character strings are stored in the memory circuit 40.

In storing character strings, a sequence of input characters applied to data input terminals 81 are stored in one memory area selected by the external selection signal applied to the selection signal input terminals 184.

In identification of character strings, the selection signal producing circuit 52 sequentially produces a plurality of selection signals for selecting the memory areas 41 through 44, respectively, during a time period when an imput character data signal is applied to the data input terminal 81. In this embodiment, each selection signal has the selection code bits SC1 and SC2 similar to that in FIG.1 because the memory circuit 40 is divided into four memory areas. Accordingly, the input characters are applied to the memory areas 41 through 44 one after another through memory areas selector 54 according to the selection signals sequentially generated from the selection signal producing circuit 52. Then, the memory areas sequentially and individually produce the character match signals in the manner as described in connection with the memory circuit 40 in FIG. 1. The character match signals from the memory areas 41 through 44 are applied to the sequential processing circuits 91 through 94, respectively. The sequential processing circuits 91 through 94 sequentially operate one after another by the shift clock signal from the shift clock signal generating circuit 182. Operation of the sequential processing circuits 91 through 94 are synchronized with selection of the memory areas 41 through 44. Each of the sequential processing circuits 91 through 94 operates in the similar manner as the sequential processing circuit 90 in FIG. 8 and receives the character match signals sequentially produced from the corresponding memory area and produces the string match signal. The string match signal is applied to the encoder 51 having a priority encoder similar to that shown at 50 in FIG. 8. Then, the encoder 51 produces the identified code signal in response to the string match signal in a manner similar the priority encoder 50 in FIGS. 8 and 10. On the other hand, the selection signal is directly delivered from the device as a memory area code. A combination of the memory area code and the identified code gives a retrieved code.

Thus, a sequence of input characters can be identified with all of the memorized characters in all of the memory areas.

Figure 21:
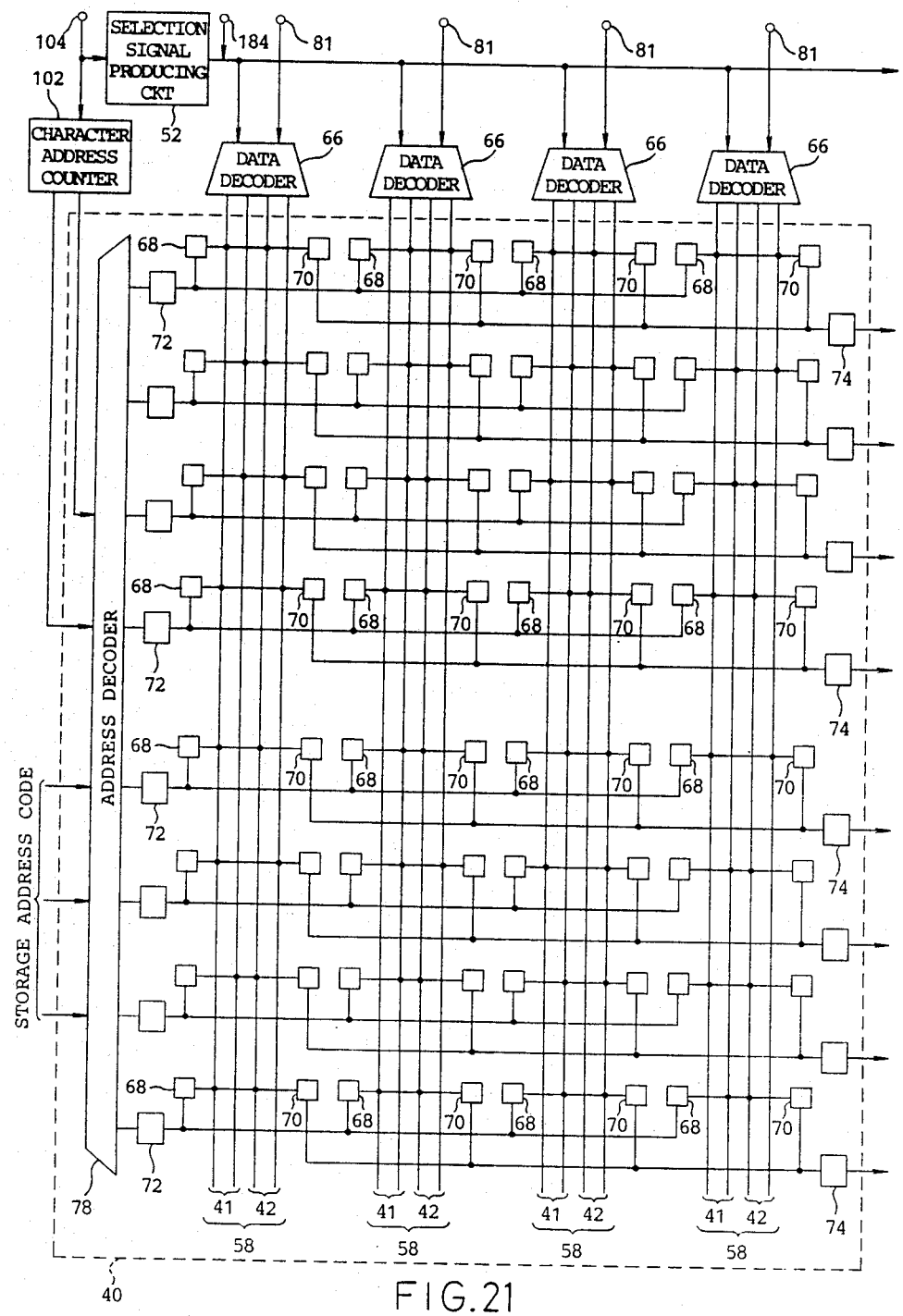
FIG. 21 is a block diagram of an associative memory circuit used in the character string identification device.
Figure 22:
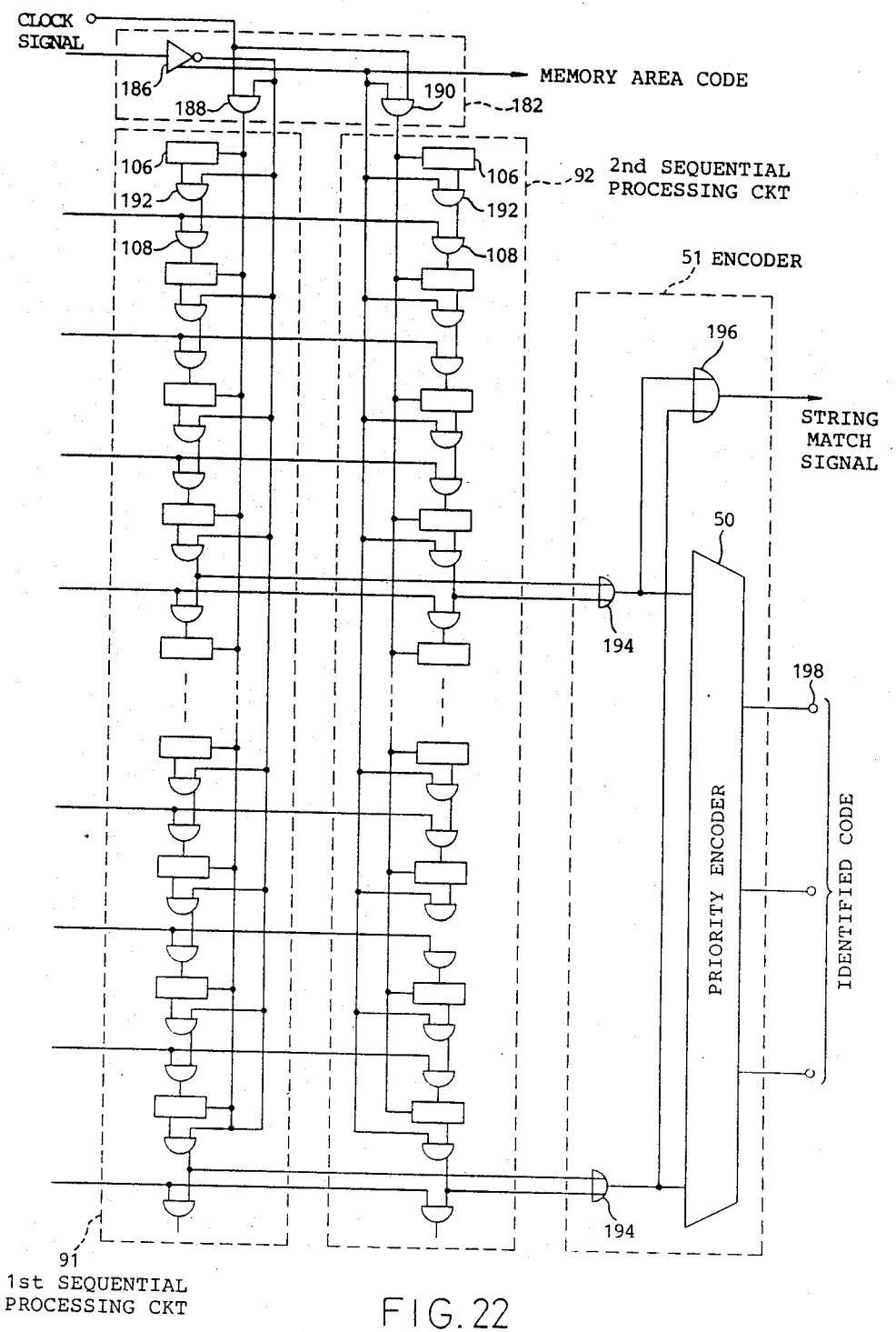
FIG. 22 is a block diagram of a sequential processing circuit used in the character string identification device.

FIGS. 21 and 22 show a circuit diagram of a character string identification device according to the embodiment of FIG. 20 but which is shown in connection with the memory circuit 40 having not four but two memory areas 41 and 42 for the purpose of simplification of the drawings.

Referring to FIG. 21, the memory circuit 40 is similar to that in FIG. 2 except that each memory matrix 58 has not eight but four word lines 60 and therefore has four memory cells 64 on one bit line 62. Each memory matrix 58 has associated individual data decoder 66 which is similar to that in FIG. 2. Each data decoder 66 responsive to the selection signal selects two word lines 60 in each memory matrix 58 which is assigned to one of the two memory areas 41 and 42 which is indicated by the selection signal. In this embodiment, the selection signal from the selection signal producing circuit 52 or the selection signal input terminal 184 has a single bit code so as to indicate one of two memory areas. That is, the first and second memory areas 41 and 42 are indicated by "0" and "1" of the single bit code of the selection signal, respectively.

Other arrangements and operation of the memory circuit 40 and data decoders 66 are similar to those in FIG. 2, and description thereto is therefore not repeated for the purpose of simplification of the description.

The device is shown to be further provided with a clock signal input terminal 104 and an address counter 102 similar to those in FIG. 10. The clock signal is applied to the selection signal producing circuit 52 and the address counter 102 through the shift clock signal input terminal 104 from an external device (not shown) in synchronization with application of the input character to the data input terminals 82. It should be noted that the clock signal has a frequency twice higher than an application frequency of the input character.

The character address counter 102 is used in storing characters in the memory 40 and counts the clock signal in a similar manner as that in FIG. 10. The address decoder 78 produces the decoded signal from the storage address code in reference to the content of the address counter 102 so as to indicate one of the common write-in circuits 72 in a similar manner as in FIG. 10.

Referring to FIG. 22, two first and second sequential processing circuits 91 and 92 are coupled to the memory circuit 40 because the memory circuit 40 has two memory areas 41 and 42 in FIG. 21. Both of the sequential processing circuits 91 and 92 have a similar circuit arrangement and are alternately driven by the shift clock signal from the shift clock signal generating circuit 182 in synchronization with selection of one of the memory areas 41 and 42.

The shift clock signal generating circuit 182 comprises an inverter 186 and two AND gates 188 and 190. The inverter 186 receives the selection signal from the selection signal producing circuit 52 and produces an inverted signal and a non-inverted signal. The inverted signal is applied to one input terminal of the AND gate 188 while the clock signal is applied to the other input terminal of the AND gate 188. Accordingly, when the selection signal is "0," the clock signal is delivered from the AND gate 188 as the shift clock signal which drives the first sequential processing circuit 91.

On the other hand, the non-inverted signal is applied to one input terminal of the AND gate 190 while the clock signal is applied to the other input terminal of the AND gate 190. Therefore, when the selection signal is "1," the clock signal is applied to the second sequential processing circuit 92 as the shift clock signal so as to driven the second sequential processing circuit 92.

The sequential processing circuits 91 and 92 have a same circuit arrangement which is similar to the cascade arrangement in the sequential processing circuit 90 as shown in FIG. 10 except for additional AND gates 192. Therefore, the similar parts are represented by the same reference numerals of FIG. 10. Each of the additional AND gates 192 are connected to bridge each adjacent flip flop of the flip flops 106 and the AND gates 108 in the cascade connection. The non-inverted signal and the inverted signal from the inverter 186 control the additional AND gates 192 in the first and the second sequential processing circuits 91 and 92, respectively. Therefore, the inverted signal opens the additional AND gates 192 in the first sequential processing circuit 91 when the selection signal is "0," so as to permit the cascade connection to transfer the "1" signal from one stage flip flop 106 to the next stage flip flop 106 in the first sequential processing circuit in response to the character match signal from the first memory area 41. Meanwhile, the non-inverted signal opens the additional AND gates 192 in the second sequential processing circuit 92 when the selection signal is "1." Therefore, the logic "1" level signal is transferred in the cascade connection in the second sequential processing circuit 92 in response to the character match signal from the second memory area 42.

Outputs are led out from AND gates 108 at each four-stage interval in the cascade connection and are commonly applied to an OR gate 194 as the character string match signal.

The encoder 51 comprises the above-described OR gates 194, another OR gate 196, and the priority encoder 50. The OR gate 196 receives outputs of the OR gates 194 and produces the string match signal when any one of the outputs from the OR gates 194 is "1." The priority encoder 50 receives the outputs of the OR gates 194 and produces the identified code indicative of the high order memory address where the match occurs.

Although the priority encoder is well known itself in the prior art, and example is shown in FIG. 23.

Referring to FIG. 23, the priority encoder 50 shown therein is an eight-bit to three-bit priority encoder which is implemented by twelve (12) gates 200 through 211, and four (4) OR gates 212 through 215 so as to enable to encode eight output signals 1940 through 1947 from eight (8) OR gates 194 to produce on the three (3) output terminals 1980 through 1982 an encoded signal indicative of the address code of a three-bit length as the identified code. For example, when the first output signal 1940 is "1" with remaining output signals 1941 through 1947 being "0," all of the signals on three output terminals 1980 through 1982 are "0" so that an address code of "000" is obtained as the encoded signal. When the second output signal 1941 is "1" with the third through eighth output signals 1942-1947 being "0," a logic "1" signal is present on the first output terminal 1980 in no relation to the first output signal 1940 while signals on the remaining two output terminals 1981 and 1982 are maintained "0." Therefore, and address code of "001" is obtained as the encoded signal. When third output signal 1942 is "1" with fourth through eighth output signals 1943-1947 being "0," and address code of "010" is obtained from the three output terminals 1980 through 1982 as the encoded signal in no relation to the first and second output signals 1940 and 1941. Similarly, when fourth through seventh output signals become "1" one after another, the address code represented by the encoded signal changes from "011" to "110" by a binary "1." At the end, when the eighth output signal 1947 is "1," the encoded signal is an address code of "111" in no relation to the remaining first through seventh output signals 1940-1946.

When two hundred fifty-six (256) character strings are memorized in one memory area of the memory circuit 40 in FIG. 20, the five hundred twelve (512=256×2) string match signals are delivered from the sequential processing circuits 91 and 92. In the encoder 51, two hundred fifty-six (256) OR gates 194 are used to produce two hundred fifty-six (256) output signals. As a priority encoder for encoding the two hundred fifty-six (256) signals to an address code of eight bits, a 256-bit to 8-bit priority encoder is required and can be realized by use of thirty-three (32) eight-bit to three-bit priority encondors of FIG. 23 as has been well known in this prior art. In the case, EI, EO, and PRF terminals 216, 217, and 218 shown in FIG. 23 are used for connecting between the priority encoders. A gate 219 is an AND gate for receiving the EI signal and an inhibit of the PRF signal to produce the EO signal.

As will be understood from the above description, the priority encoder can be simplified in arrangement and reduced in size in spite of a large number of character strings memorized in the memory.

Figure 24:
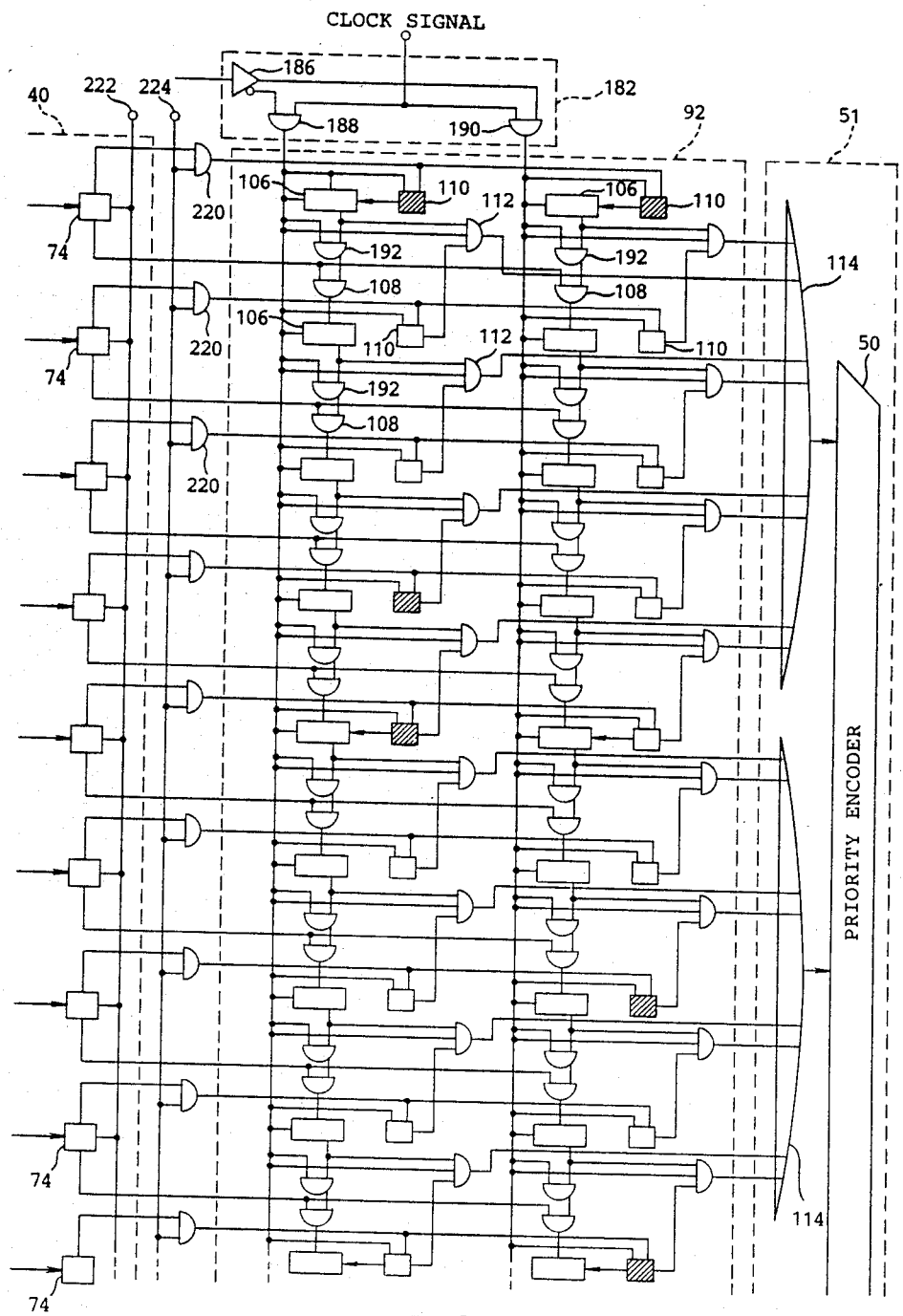
FIG. 24 is a block diagram of another sequential processing circuit used in the character string identification device.

Turning to FIG. 24, a modification of sequential processing circuits 91 and 92 is illustrated together with the shift clock generating circuit 182, the encoder 51, and common read-out circuits 74 in the associative memory circuit 40. In the modification shown in the figure, the sequential processing circuits 91 and 92 comprise the similar cascade connection of the flip flops 106, the AND gates 108, and additional AND gates 192 which are described in connection with FIG. 22. The sequential processing circuits 91 and 92 are further provided with means for checking up the character strings having various character lengths similar to that in FIG. 10. That is, each of the first and second sequential processing circuits 91 and 92 has registers 110 for holding the delimiter signal. In each of sequential processing circuits 91 and 92, the registers 110 are provided corresponding to flip flops 106 in each stage.

It is assumed that each of the character strings comprises four characters as a general rule but can comprise characters of more or less than four. Accordingly, in order to indicate the start of each memorized character string of four characters, the delimeter signal is stored in the first stage register 110 and other registers 110 at each four stage interval counted from the first stage register, for example, fifth stage register, ninth stage register, and so on, as a general rule. The registers at each four stage interval such as first, fifth, and ninth registers are called character start stage registers and are coupled with the flip flops 106 corresponding to those character start stage registers, as shown in the figure. The flip flop corresponding to the character start stage registers 110 are called character start stage flip flops. Therefore, those character start stage flip flops 106 are supplied with the delimiter signal from the character start stage registers 110 storing the delimeter signal. However, when the memorized character string has more than four characters, for example, seven characters, the delimiter signal is registered in not the character start stage register 110 at the fifth stage but the eighth register counted from the character start stage register 110 corresponding to the first character of the memorized character string. When the memorized character string has less than four characters, for example, three characters, the delimiter signal is registered in the register 110 at a stage, for example, fourth stage, corresponding to a character address next adjacent a character address of the last character of the memorized character string.

In FIG. 24 several registers of registers 110 are shown as shaded blocks for illustrating those registers storing the delimiter signal. That is, the delimiter signal is always stored in first stage register 110 in each of the sequential processing circuits 91 and 92. In the first sequential processing circuit 91, the delimiter signal is stored in the fourth register 110. This means that the first one of the memorized character strings is constituted by three characters. Further, the ninth register 110 is not shown to store the delimiter signal. Therefore, it will be understood that the second one of the memorized character string has more than four characters.

In the second sequential processing circuit 92, the delimiter signal are shown to be stored in the first, the seventh, and the ninth register 110. This teaches that the first one of the memorized character strings in the second memory area has six characters.

The sequential processing circuits 91 and 92 are additionally provided with a circuit for writing the delimiter signal in the registers 110 as required. The circuit comprises a plurality of write-in AND gates 220 which have outputs connected to registers 110 at every stage in each of the first and second sequential processing circuits 91 and 92 as shown in the figure. Each of the write-in AND gates 220 has a first input connected to an additional output terminal of the common read-out circuit 74 on a corresponding bit or character address. Each common read-out circuit 74 produces a write-in a signal on the additional output terminal when the character storage operation is carried out for the character address of the memory circuit 40. Each of the common read-out circuits 74 has a control terminal for receiving a read/write mode signal applied through a read/write mode input terminal 222. When the read/write mode signal indicates the read mode, the common read-out circuit 74 produces the character match signal as described before in connection with FIG. 2. On the other hand, when the read-out mode signal indicates the write mode, the common read-out circuit 74 produces the write-in signal on the additional output terminal.

Each of the write-in AND gates 220 has a second input connected with a start/end input terminal 224. In character storage operation into the memory circuit 40, a character start signal is applied to the start/end terminal 224 when the first character of the character string is stored. Accordingly the character start signal is applied through that one of the write-in AND gates 220 which is opened by the character write-in signal for the first character to one of the registers 110 corresponding to one of the write-in AND circuits 220. Therefore, the character start signal is registered as the delimiter signal in the register 110. On the other hand, after the last character of the character string is stored in one of the character addresses in one of the memory areas, the write-in signal is applied to the next succeeding character address in the memory area. Simultaneously, the character end signal is also applied to the start/end input terminal 224 so that the character end signal is registered as the delimiter signal in that one of the registers corresponding to the next succeeding character address.

The non-inverted signal and the inverted signal from the inverter 186 are applied to the registers 110 in the first and the second sequential processing circuits 91 and 92, respectively. Therefore, during character storage operation for one of the first and second memory areas 41 and 42 (FIG. 21), the delimiter signal is applied to the registers 110 included in the corresponding one of the first and the second sequential processing circuits 91 and 92 but is not applied to the registers 110 in the other one of the sequential processing circuits 91 and 92.

In each of the sequential processing circuits 91 and 92, AND gates 112 are connected to outputs of flip flops 106 and registers 110, respectively, as shown in the figure. Outputs of the AND gates 112 in the four succeeding stages are connected, as a group, to one OR gate 114 similar to that in FIG. 10, so that the string match signal is produced from the OR gate 114. The string match signals from a plurality of OR gates 114 are applied to the priority encoder 50 similar to that in FIG. 23.

Now, description will be made in connection with operation of sequential processing circuits 91 and 92 during the character string indentification.

Figure 25:
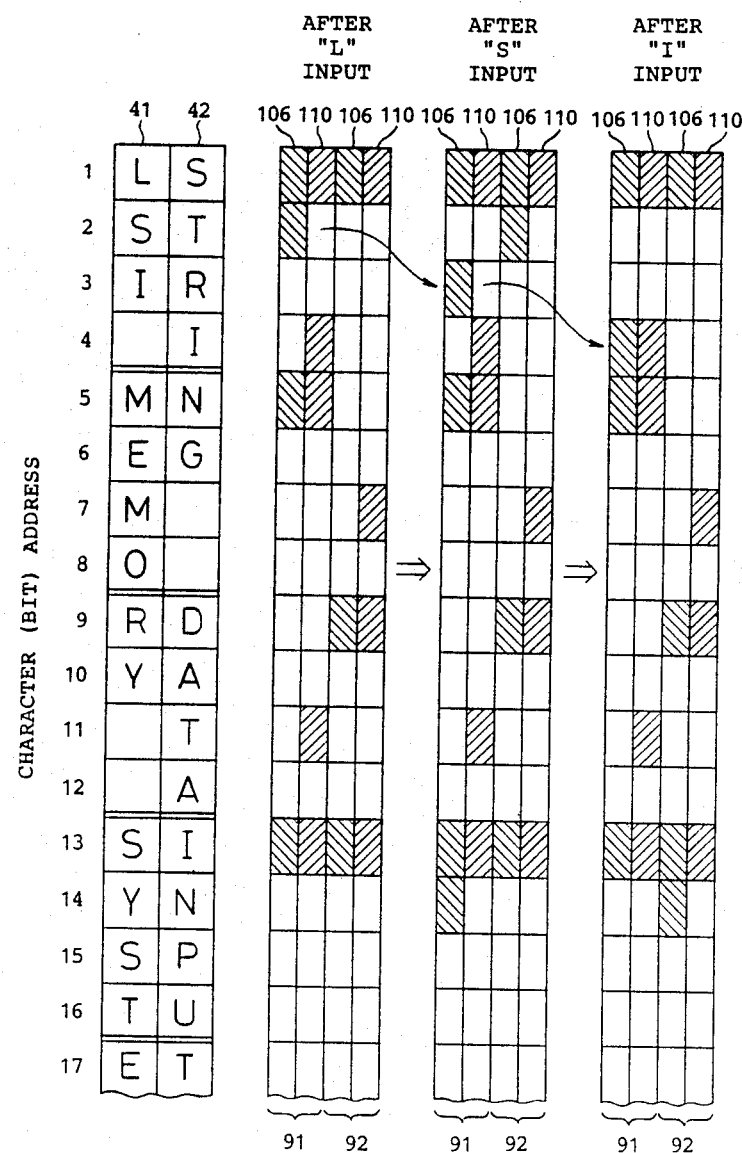
FIG. 25 is a view for use in describing operation of the sequential processing circuit shown in FIG. 24.

Referring to FIG. 25, it is assumed that the first and the second memory areas 41 and 42 store the character strings as shown in the figure. In applying the input character to the memory circuit 40, it is understood that the delimiter signal, or the logic "1" level signal, is held in the first, the fifth, and the thirteenth registers 110 in the first sequential processing circuit 91. Therefore, flip flops 106 at the same stages take the logic "1" level. Further, the fourth and the eleventh registers 110 also hold the delimiter signal stored by the character end signal.

On the other hand, the delimiter signal is stored in the first, the seventh, the ninth, and the thirteenth registers 110 in the second sequential processing circuit 92. Therefore, the first, the ninth, and the thirteenth flip flops 106 hold the logic "1" level.

When the input character "L" is applied to the memory circuit 40, the character matching operation is carried out in the first and the second memory areas 41 and 42 sequentially, as described above. The character match signal is produced from the first character address in the first memory area 41, while no character match signal is produced from the other character addresses in both of the first and the second memory areas 41 and 42. Therefore, the logic "1" level is delivered from the first flip flop 106 to the second flip flop 106. No change occurs in the other flip flops 106. This state is illustrated at a column labeled as "AFTER "L" INPUT" in FIG. 25.

In FIG. 25, a shade is drawn in the flip flops 106 and registers 110 having the logic "1" level.

Next, when the input character is "S," the character match signal is produced from the second, the thirteenth, and the fifteenth character address in the firt memory area 41. Therefore, the logic "1" level shifts into the third flip flop 106 from the second flip flop 106 and the logic "1" level is stored into the fourteenth flip flop 106 by the thirteenth flip flop 106 in the first sequential processing circuit 91. The sixteenth flip flop 106 does not receive the logic "1" level signal from the fifteenth flip flop 106 because the fifteenth flip flop does not store the logic "1" level. The character match signal is also produced from the first character address in the second memory area 42. Therefore, the second flip flop 106 takes the logic "1" level due to the output of the first flip flop 106 in the second sequential processing circuit 92. This state is illustrate in another column labeled as "AFTER "S" INPUT" in FIG. 25.

Then, after the input character "I" is applied, the fourth flip flop 106 in the first sequential processing circuit 91 takes the logic "1" level shifted from the third flip flop 106 in response to the character match signal from the third character address in the first memory area 41. In the second sequential processing circuit 92, the logic "1" level is stored into the fourteenth flip flop 106 by the output from the thirteenth flip flop 106. This state is shown at the right hand column labeled as "AFTER "I" INPUT."

After the fourth flip flop 106 takes the logic "1" level in the first sequential processing circuit 91, the third AND gate 112 (FIG. 24) produces the string match signal because the fourth register 110 also takes the logic "1" level. The string match signal is applied to the priority encoder 50 through the OR gate 114. Thus, the character string "LSI" is identified and the identified code is delivered from the priority encoder 50.

Identification of the other character strings can be carried out in the similar manner as described above.

In FIG. 26, an example of memory cell 64 shown therein is a random access memory (RAM) cell. The RAM cell is a typical static RAM cell which comprises four MOS transistors 138, 140, 150, and 152 and resisters 142 and 144 as shown in FIG. 16. For the SRAM cell, a bit line 62 comprises a pair of two lines 62A and 62$\overline{A}$. Therefore, when the SRAM is used as each memory cell 64 in the memory matrix 58 in the memory circuit 40 in FIG. 2 and other embodiments, the paired lines 62A and 62$\overline{A}$ are commonly connected to the individual write-in circuit 68 and the individual read-out circuit 70 as shown in the figure.

Under a condition where the one line 62A of the paired bit line is at the high level, MOS transistors 150 and 152 become conductive when the word line 66 is brought to the high level. As a result, gate terminals of the transistors 138 and 140 become at the low and the high levels, respectively, so that the SRAM cell stores "1."

When a high level signal is applied to the word line under a condition where the SRAM cell stores "1," the high level signal is present on the one line 62A of the paired lines. The high level signal is read out at the individual read-out circuit 70.

Figure 27:
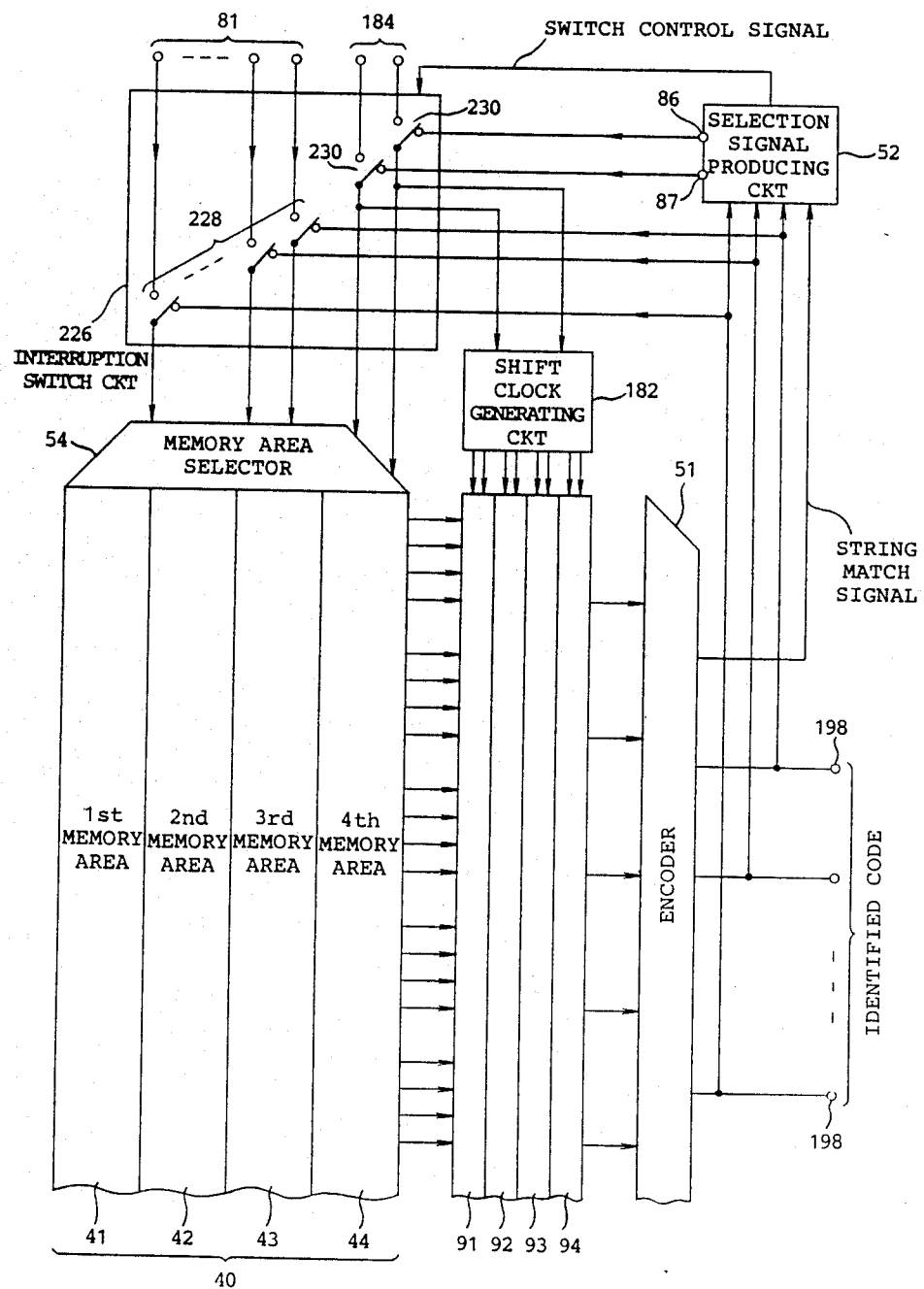
FIG. 27 is a block diagram of a character string identification device according to a fifth embodiment of the present invention.

Referring to FIG. 27, a character string indentification device according to another embodiment is similar to the device shown in FIGS. 20-24 except for an interruption switch circuit 226. The similar parts are represented by the same reference numerals as in FIGS. 20-24 and description thereto is not repeated for the purpose of simplification of the description.

The data input terminal 81 and the selection signal producing circuit 52 are coupled to the memory area selector 54 through the interruption switch circuit 226.

The interruption switch circuit 226 comprises a set of switches 228 for selectively connecting one of the data input terminal 81 and the encoder output terminals 198 to the memory area selector 54. The interruption switch circuit 226 is also provided with another set of switches 230 for selectively connecting the selection signal input terminal 184 and the selection signal generating circuit 52 to the memory area selector 54.

The set of switches 228 usually connect the data input terminals 81 to the memory area selector 54. However, the set of switches 228 switch over from the data input terminals 81 to the encoder output terminals 198 when receiving a switch control signal supplied from the selection signal producing circuit 52. Although the set of switches 230 usually connects the selection signal producing circuit 52 to the memory area selector 54, the set of switches 230 is, for example, manually switched so as to connect not the selection signal producing circuit 52 but the selection signal input terminals 184 when the character strings are stored in the memory circuit 40.

The selection signal producing circuit 52 usually produces the selection signal for selecting the first memory area 41. When receiving the string match signal 198 from the encoder 51, the selection signal producing circuit 52 produces the switch control signal and changes the selection signal from a selection code for the first memory area 41 to another selection code for the second memory area 42. The selection code is held on the selection signal output terminals 86 and 87 for a predetermined time period. When receiving the next string match signal during the predetermined time period, the selection signal producing circuit 52 again produces the switch control signal and also changes the selection code for the second memory area 42 to a selection code for the third memory area 43. Similarly, the next string match signal makes the selection code producing circuit 52 change from the selection code for the third memory area 43 to a selection code for the fourth memory area 44 and also produce the switch control signal. In the shown embodiment, the memory circuit 40 is shown to be provided with four memory areas. Therefore, the selection signal producing circuit 52 again produces the selection signal for selecting the first memory area 41 when the next string match signal is produced from the fourth sequential processing circuit 94.

When no string match signal is produced from the encoder 51 during the predetermined time period after change from one selection code to another selection code, the selection signal producing circuit 52 again produces the selection signal for selecting the first memory area 41.

It should be noted that the above described operation is different from that of the selection signal producing circuit 52 in FIG. 20. That is, the input character incoming through the data input terminals 81 is always supplied to the first memory area 41 alone. When the switch control signal is supplied to the interruption switch circuit 226 and when the selection control signal is simultaneously supplied to the interruption switch circuit 226 for selecting, for example, the second memory area 42, the identified code is applied as an interruption input character to the second memory area 42 from the decoder output terminals 198 through the set of switches 228 and the memory area selector 54. Accordingly, the identification is carried out in the second memory area 42 for the interruption input character given by the identified code obtained from the character string identification performed in the first memory area 41.

It will be understood from this that each of the memorized character strings in the first memory area 41 is replaced by one of the memorized characters stored in the second memory area 42. By the same reason, one of memorized character strings in the second and the third memory areas 42 and 43 are also represented by ones of the memorized characters in the third and fourth memory areas 43 and 44.

This is quite advantageous for storing and retrieving numerous significant combinations of language terms in the memory having a comparatively small memory capacity. This is because different significant language terms can be replaced by different characters, respectively, by storing the different significant language terms in the first memory area 41. Different significant combinations of the terms can be represented by short character strings each having only two or three characters and can be stored in the second memory area 42. Further, the short strings can be represented by different characters. Therefore, one character can represent a significant combination of significant combined language terms and another significant combined language terms.

Referring to FIG. 28, there are a plurality of language phrases which are significant combinations of language terms, for example, "NATURAL LANGUAGE PROCESSING TECHNIQUE," "ELEMENTARY NATURAL LANGUAGE PROCESSING," and "LANGUAGE INFORMATION PROCESSING TECHNIQUE," and so on. These phrases can be broken into different significant short phrases which comprise a reduced number of terms. For example, "NATURAL LANGUAGE PROCESSING TECHNIQUE" is broken into "NATURAL LANGUAGE," "LANGUAGE PROCESSING," "PROCESSING TECHNIQUE" and so on. Other phrases can be also broken as shown in FIG. 28. These broken phrases can further be broken into significant elementary terms, that is, "NATURAL LANGUAGE" can be broken into two elementary terms of "NATURAL" and "LANGUAGE."

It will be understood from FIG. 28 that many phrases may includes same terms. Then, it is not preferable for memory utilization efficiency to store those phrases in the memory one by one because the same term is repeatedly stored in the memory.

The device described in connection with FIG. 27 can reduce such a disadvantage by a using method as described below.

First code characters such as "A," "B," "C," "D" and others are predetermined for the elementary terms, such as "NATURAL," "LANGUAGE," "PROCESSING," "TECHNIQUE," and others, respectively. Then, phrases of two terms such as "NATURAL LANGUAGE," "LANGUAGE PROCESSING," "PROCESSING TECHNIQUE," and others can be represented by combinations of two first code characters such as "AB," "BC," "CD," and so on. Further, second code characters such as "a," "b," "g" and others are previously determined for combinations of first code characters "AB," "BC," "CD," and others. Then, phrases such as "NATURAL LANGUAGE PROCESSING TECHNIQUE" can be represented by a combination of second code characters, that is, "ag" (="AB"+"CD"). Thus, it is possible to represent a phrase of four terms by two second characters by predetermining second code characters for various combinations of two first code characters. It is possible to assign second code characters to some of the first code characters, respectively. Then, phrases of three terms can be represented by combinations of two second code characters. In a similar manner, third code characters can be predetermined for combinations of two second code characters. In FIG. 29, the phrase "NATURAL LANGUAGE PROCESSING TECHNIQUE" is represented by one third character "I."

In use of the code characters as described above, the elementary terms are stored in the first memory area 41 as the memorized character strings as shown in FIG. 29. Combinations of two first code characters for first phrases are stored in the second memory area 42 as the memorized character strings. If desired, it is possible to store the first code characters with a single character form as one character. Further, combinations of two second code characters for second phrases are stored in the third memory area 43 as the memorized character strings.

In the similar manner, higher order code characters can be used and are stored in the memory areas for phrases of more terms.

From character string identification for the first memory area 41, the identified code is obtained which indicates a first code character for representing one of terms or character strings as identified. As shown in FIG. 29, a character "A" is obtained as the first code character from identification of "NATURAL." Then, the string match signal is also produced and is supplied to the selection signal generating circuit 52. In response to the string match signal, the selection signal generating circuit 52 produces the switch control signal and the selection signal for selecting the second memory area 42. Then, the set of switches 228 is switched from data input terminals 81 to the encoder output terminals 198. The first code character is applied to the second memory area 42 through the switches 228 and the memory area selector 54 as the input character. By the character identification of "A" in the second memory area 42, a character match signal is produced from the second memory area 42. However, since "B" is not yet applied to the second memory area 42, the string match signal is not produced from the encoder 51. Therefore, the selection signal producing circuit 52 stops the switch control signal and again produces the selection signal for selecting the first memory area 41 after the predetermined time period from reception of the string match signal. As a result, the data input terminals 81 are connected to the memory area selector 54. Then, the input character is applied to the first memory area 41. After completing identification of a sequence of input characters "LANGUAGE," the string match signal and the identified code or the first character "B" are produced from the encoder 51. Thus, the selection signal producing circuit 52 operates in response to the string match signal, and the first code character "B" is identified in the second memory area 42 in a similar manner as described above. The character matching results in generation of the character match signal from the second memory area 42. Then, the second sequential processing circuit 92 produces the string match signal because the charater match signal for first code character "A" is already held in the second sequential processing circuit 92. Therefore, the encoder 51 produces the string match signal and the second code character "a" corresponding to the combination of first code characters "A" and "B." In response to the selection signal, the selection signal generating circuit 52 continues to produce the switch control signal and also changes the selection signal from selection code for selecting the second memory area 42 to the selection code for selecting the third memory area 43. Then, the memory area selector 54 applies the second code character "a" as the input character to the third memory area 43 through the set of switches 228. Identification of "a" is carried out in the third memory area 43. As a result, the third memory area 43 produces the matching signal. However, for a similar reason, the string match signal is not produced from the third sequential processing circuit 93. Therefore, the selection signal producing circuit 52 stops the switch control signal and again produces the selection signal for selecting the first memory area 41. Accordingly, the input characters are applied to the first memory area 41. When the input character string "PROCESSING" is identified in the first memory area 41, the string match signal is produced and the second code character is produced. Thereafter, the first code character "C" is identified in the second memory area 42, then the first memory area 41 carries out character identification for a sequence of input characters through the data input terminals 81 to produce the string match signal for "TECHNIQUE" and first code character "D." Accordingly, the second memory area 42 produces a character match signal and the second sequential processing circuit 92 produces the string match signal for the character string "CD" and the second code character "g." Then, the character identification for "g" is carried out in the third memory area 43. Accordingly, the character match signal is produced from the third memory area 43 and the third sequential processing circuit 93, therefore, produces the string match signal for the character string "ag" and the third code character "I." As a result, identificaton is completed for the phrase "NATURAL LANGUAGE PROCESSING TECHNIQUE."

Identification of other phrases can be carried out in a similar manner. Therefore, it is not necessary to store the same terms repeatedly but phrases having the same term or terms can be easily identified.

In the device shown in FIG. 27, the selection signal producing circuit 52 can comprise a counter for counting the string match signal from the encoder 51 and a timer for defining the predetermined time period. The timer also produces the switch control signal in response to the string match signal. Such a timer can be constructed by a monostable multivibrator.

In a modification, the selection signal producing circuit 52 can have a simple memory storing a list of selection code and the first, the second, and the third code characters. In that case, the selection signal producing circuit 52 is made to receive the identified code from the encoder 51. Thus, the selection signal producing circuit 52 produces the selection signal with reference to the list in response to the identified code representative of the first, the second, and the third code characters.

What is claimed is:

1. A character string identification device for identifying a sequence of input characters to produce an identified code indicative of a result of identification, said character string identification device comprising:

associative memory means, having memory locations for preliminarily storing a plurality of memorized characters and for deciding a best match between each of said input characters and one of said memorized characters and for producing a character match signal representative of a memory location for said one of said memorized characters, sequential processing means, coupled to said associative memory means, for sequentially processing character match signals corresponding to respective input characters to generate a string match signal, encoding means, coupled to said sequential processing means, for encoding said string match signal into an encoded signal and for producing said encoded signal as said identified code, said memory locations arranged is first through N-th memory areas, where N represents a predetermined number, said sequential processing means including first through N-th processing sections corresponding to said first through said N-th memory areas, respectively, signal producing means for producing a selection signal designating one of said first through said N-th memory areas as a specific memory area, supplying means, coupled to said first through said N-th memory areas and to said signal producing means, for supplying each of said input characters in response to said selection signal to said specific memory area to cause said specific memory area to produce said character match signal, and activating means, coupled to said first through said N-th processing sections and to said signal producing means, for activating one of said through said N-th processing sections as a particular processing section associated with said specific memory area to cause said particular processing section to process character match signals supplied from said specific memory area into said string match signal, and each of said first through said N-th processing sections further including a plurality of stages corresponding to memory locations in each of said memory areas, and each of said stages including holding means for holding a delimiter signal, representative of a delimiter of a string of said memorized characters, in each of said memory areas.

2. A character string identification device as claimed in claim 1, wherein said signal producing means is coupled to said sequential processing means and said signal producing means produces said selection signal and a control signal in response to said string match signal, and wherein said character string identification device further comprises delivery means, coupled to said encoding means, said signal producing means, and said supplying means, for delivering said identified code to said supplying means as said input character in response to said control signal.

* * * * *